(12) United States Patent
Vanderwees et al.

(10) Patent No.: US 11,411,153 B2
(45) Date of Patent: Aug. 9, 2022

(54) MULTI-SIDED THERMAL MANAGEMENT DEVICE FOR ELECTRONIC APPARATUS

(71) Applicant: DANA CANADA CORPORATION, Oakville (CA)

(72) Inventors: Doug Vanderwees, Mississauga (CA); James R. Seager, Guelph (CA); Ihab Edward Gerges, Oakville (CA)

(73) Assignee: Dana Canada Corporation, Oakville (CA)

( * ) Notice: Subject to any disclaimer, the term of this patent is extended or adjusted under 35 U.S.C. 154(b) by 158 days.

(21) Appl. No.: 16/924,775

(22) Filed: Jul. 9, 2020

(65) Prior Publication Data
US 2021/0013390 A1    Jan. 14, 2021

Related U.S. Application Data

(60) Provisional application No. 62/872,058, filed on Jul. 9, 2019.

(51) Int. Cl.
| H01L 33/64 | (2010.01) |
| H01L 25/075 | (2006.01) |
| F21V 29/70 | (2015.01) |
| F21K 9/238 | (2016.01) |
| H01J 7/24 | (2006.01) |

(52) U.S. Cl.
CPC ............ *H01L 33/642* (2013.01); *F21V 29/70* (2015.01); *H01L 25/0753* (2013.01); *H01L 33/648* (2013.01); *F21K 9/238* (2016.08); *H01J 7/24* (2013.01); *H01L 2933/0075* (2013.01)

(58) Field of Classification Search
CPC .............. H01L 33/642; H01L 25/0753; H01L 2933/0075; F21V 29/70; F21K 9/238; H01J 7/24
See application file for complete search history.

(56) References Cited

U.S. PATENT DOCUMENTS

RE35,890 E  *   9/1998  So .......................... F28F 3/027
                                                                165/154
6,273,183 B1    8/2001  So
                        (Continued)

FOREIGN PATENT DOCUMENTS

| CN | 2043000917 U | 4/2015 |
| CN | 109488900 A | 3/2019 |
| JP | 002007301618 A | 11/2007 |

*Primary Examiner* — Mary Ellen Bowman
(74) *Attorney, Agent, or Firm* — Ridout & Maybee LLP

(57) ABSTRACT

An LED device includes a multi-sided heat spreader element with a longitudinal multi-sided wall at least partly enclosing an internal space, with a plurality of LEDs mounted to the outer surface the heat spreader element, and a flow space for a cooling medium in the internal space. The tubular heat spreader element has at least one layer of a thermally conductive metal which is bendable from a flat shape to the multi-sided shape. The multi-sided shape may be tubular with a smoothly curved or multi-faceted polygonal wall. The wall of the LED device may incorporate two-phase cooling elements such as vapor chambers to maintain the LEDs at a constant temperature, and may include a temperature-controlled fan unit to control the LED temperature, and also control the wavelength and frequency of light emitted by the LEDs. A method for manufacturing the LED device is also disclosed.

18 Claims, 18 Drawing Sheets

(56) References Cited

U.S. PATENT DOCUMENTS

| | | |
|---|---|---|
| 9,212,811 B2 | 12/2015 | Patkus et al. |
| 2010/0051168 A1* | 3/2010 | Moeskjaer ............... F16L 55/18 |
| | | 156/64 |
| 2010/0314985 A1* | 12/2010 | Premysler .......... G02B 19/0061 |
| | | 313/46 |
| 2013/0049018 A1* | 2/2013 | Ramer ................. H01L 31/052 |
| | | 977/762 |
| 2019/0033006 A1 | 1/2019 | Vanderwees et al. |
| 2020/0003354 A1* | 1/2020 | Kanres .................... F16L 55/18 |

\* cited by examiner

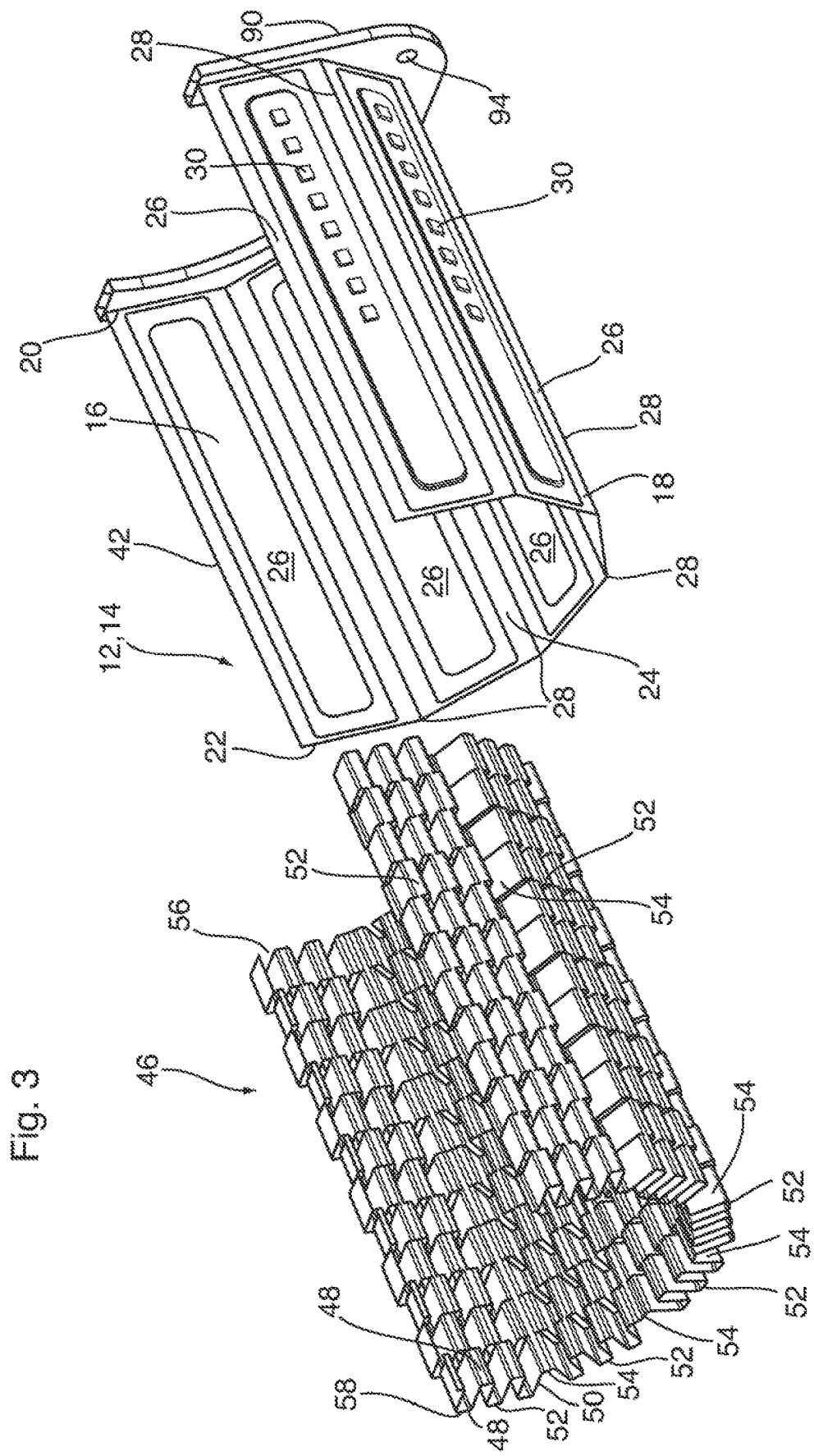

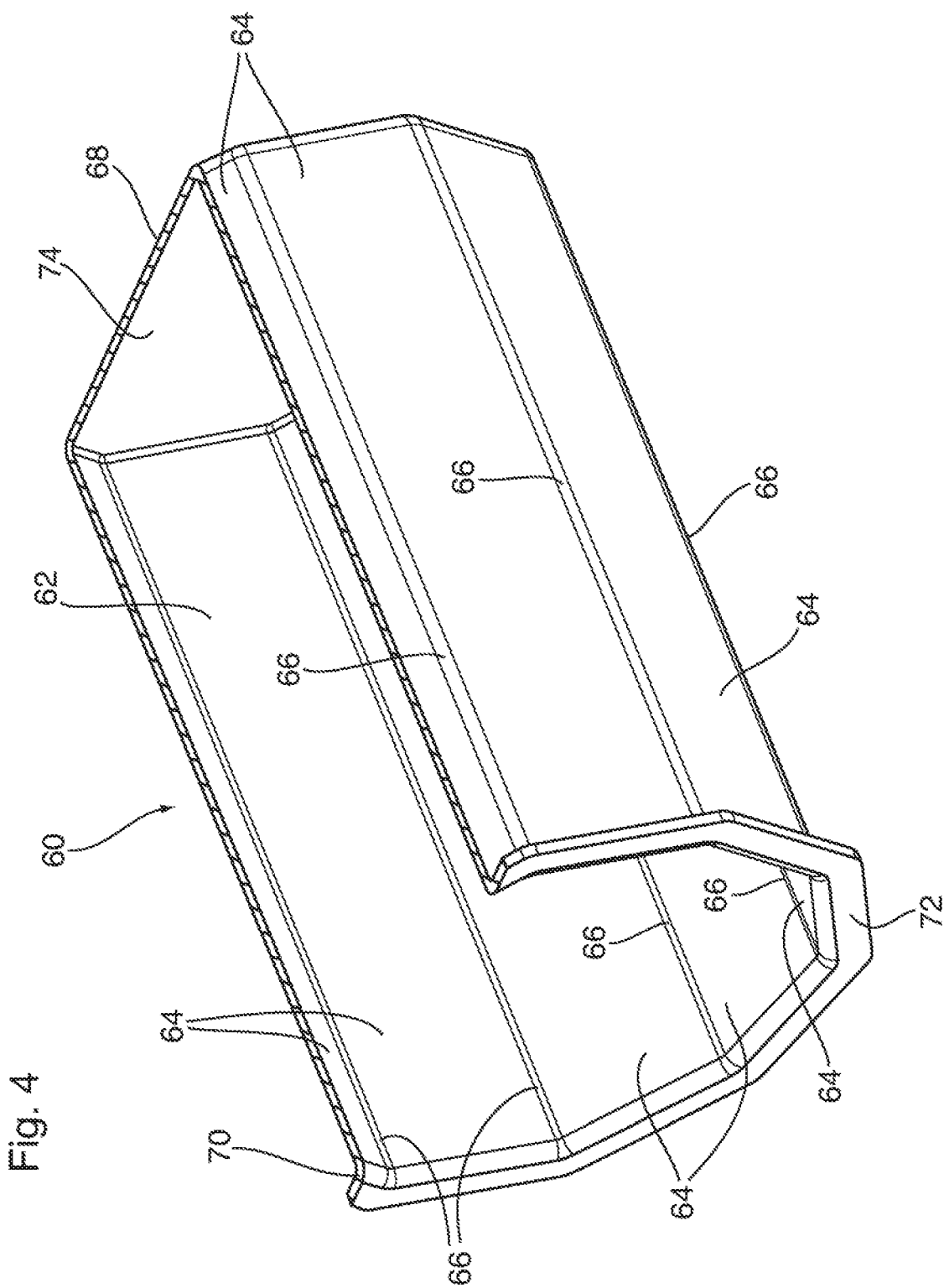

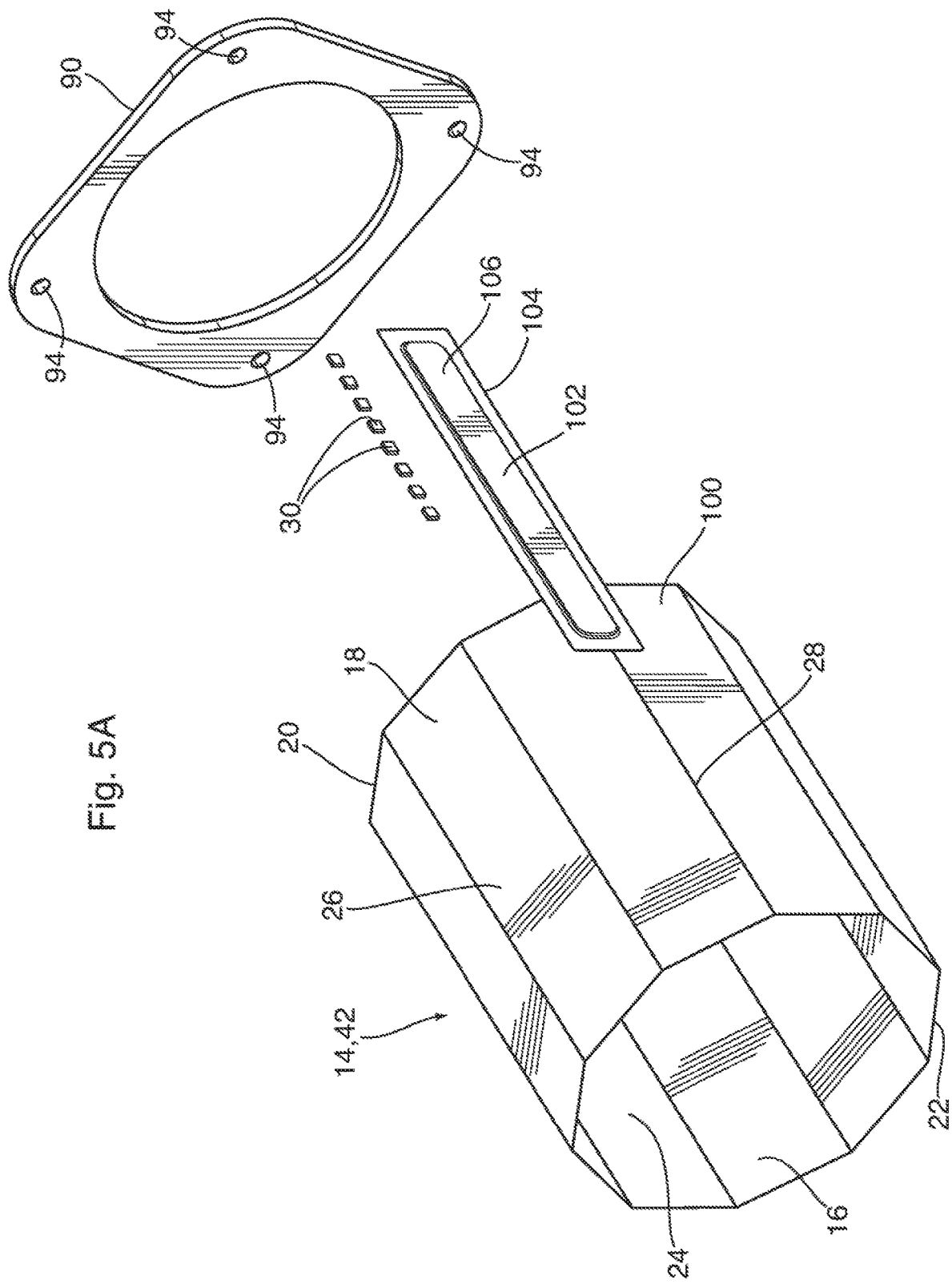

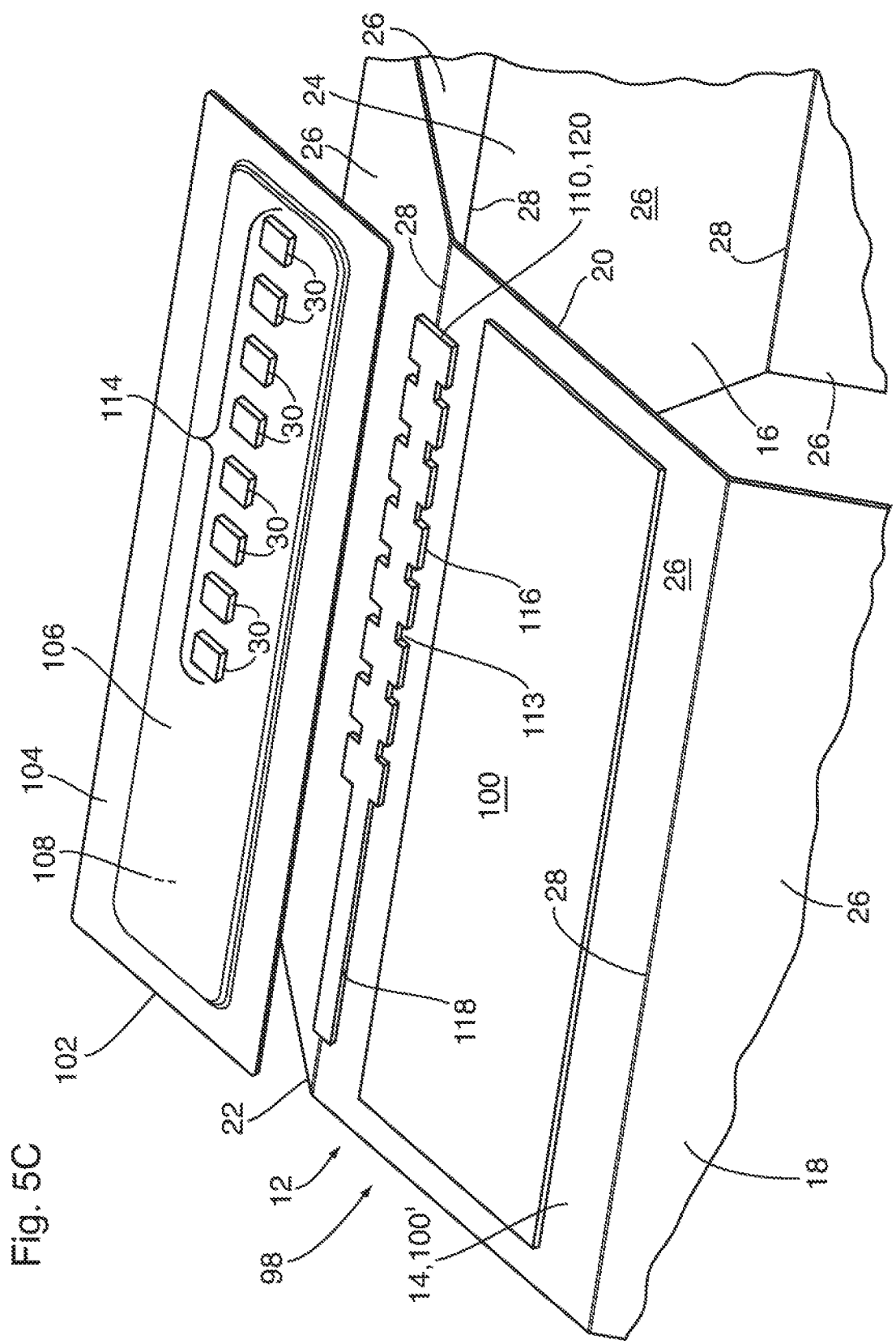

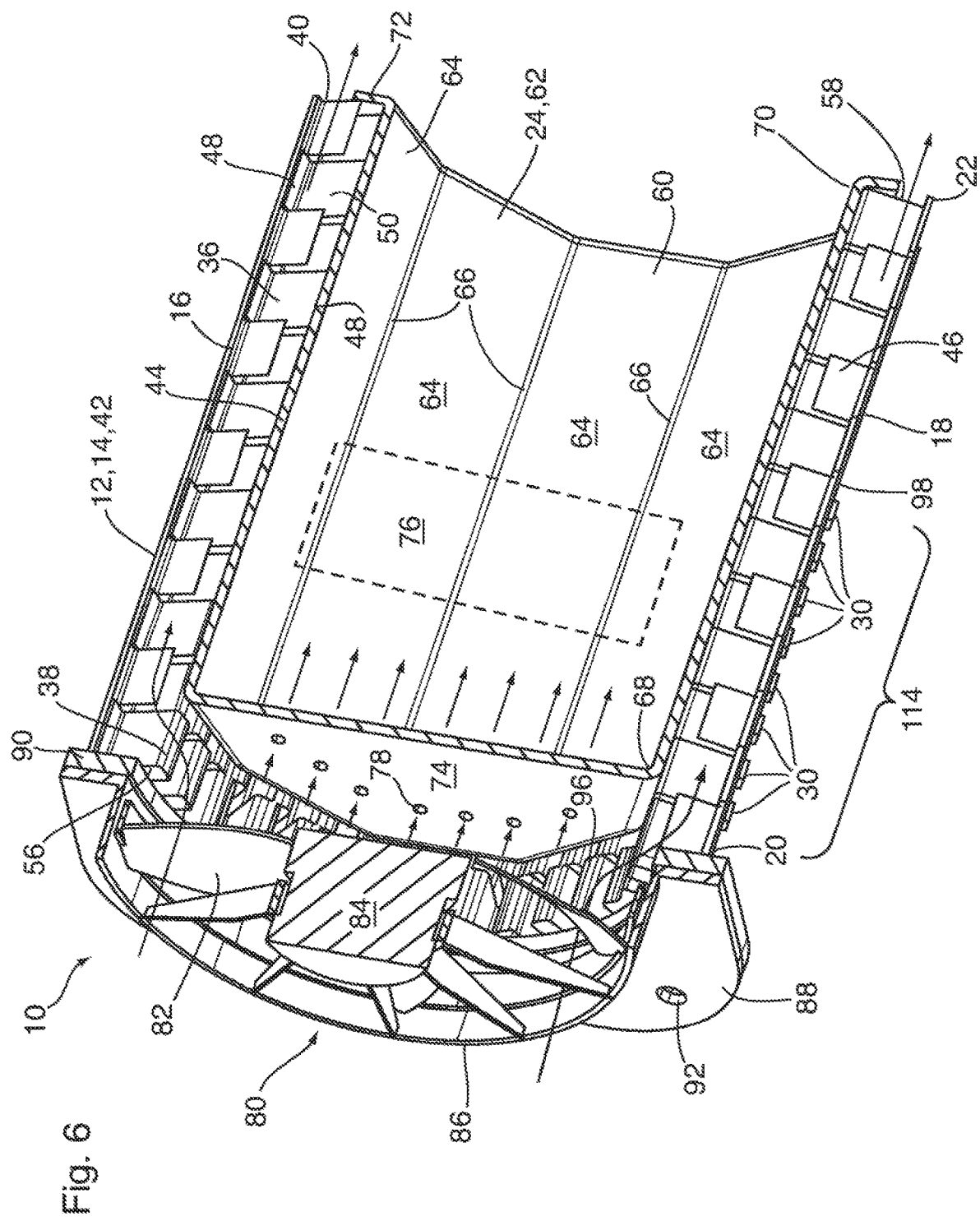

MULTI-SIDED THERMAL MANAGEMENT DEVICE FOR ELECTRONIC APPARATUS

CROSS-REFERENCE TO RELATED APPLICATION

This application claims priority to and the benefit of U.S. Provisional Patent Application No. 62/872,058 filed Jul. 9, 2019, the contents of which are incorporated herein by reference.

TECHNICAL FIELD

The present disclosure relates to thermal management of an electronic apparatus such as an electronic lighting device, particularly to a multi-sided thermal management device for an electronic apparatus, and to an electronic apparatus incorporating a multi-sided thermal management device.

BACKGROUND

Electronic devices contain heat-generating electronic components such as light emitting diodes (LEDs) and computer chips mounted on circuit boards. Examples of such devices are electronic lighting devices such as lamps or bulbs in which light is generated by LEDs rather than incandescent elements. The electronic components of such electronic devices generate heat and must be cooled to avoid reduced performance and damage caused by overheating. For example, LEDs should be maintained at a temperature below about 105° C.

While conventional ambient air cooling may be sufficient for cooling relatively low-powered electronic lighting devices, either by itself or in combination with cooling fins, heat sinks or heat pipes, such conventional cooling techniques may be insufficient for higher powered electronic lighting devices, for example those having a power of about 100 W to about 1,000 W or higher. Furthermore, it can be challenging to provide sufficient surface area for cooling in an electronic lighting device which is intended as a replacement for a conventional incandescent or halide lamp.

There remains a need for compact and effective thermal management devices for electronic lighting devices, particularly for relatively high-powered lighting devices intended as replacements for conventional incandescent or halide lamps.

SUMMARY

In accordance with an aspect of the present disclosure, there is provided a thermal management device for electronic components, comprising: (a) a multi-sided heat spreader element defining a longitudinal axis and comprising a longitudinally extending multi-sided wall and an internal space at least partly enclosed within the multi-sided wall, the multi-sided wall having an inner surface, an outer surface and longitudinally spaced first and second ends; (b) a plurality of electronic components mounted to the outer surface of the wall of the heat spreader element; and (c) a flow space for a cooling medium provided in the internal space of the heat spreader element.

According to an aspect, the tubular heat spreader element comprises at least one layer of a thermally conductive metal which is bendable from a flat shape to the shape of the multi-sided wall.

According to an aspect, the thermal management device further comprises a plurality of upstanding fins which are provided along, and in thermal contact with, at least one of the inner and outer surfaces of the multi-sided wall of the heat spreader element.

According to an aspect, at least some of the upstanding fins have free edges extending substantially transverse to the longitudinal axis.

According to an aspect, the multi-sided wall of the heat spreader element comprises at least one two-phase cooling element, wherein each two-phase cooling element is a vapor chamber or a heat pipe.

According to an aspect, each of the at least one two-phase cooling elements is elongated along the longitudinal axis; wherein each of the at least one two-phase cooling elements includes an evaporation zone and a condensation zone; and wherein each of the plurality of electronic components is located on top of and in thermal contact with the evaporation zone of one of the at least one two-phase cooling elements.

According to an aspect, the thermal management device further comprises a plurality of upstanding fins, each of which is provided on, and in thermal contact with, the inner surface or the outer surface of the multi-sided wall; and wherein each of the upstanding fins is located on top of and in thermal contact with the condensation zone of one of the two-phase cooling elements.

According to an aspect, the thermal management device further comprises one or more perforations through the multi-sided wall to permit flow of the cooling medium between the inner and outer surfaces of the multi-sided wall.

According to an aspect, the at least one bendable layer of the multi-sided wall is smoothly bent to provide the tubular wall of the heat spreader with a smoothly rounded shape, when viewed in transverse cross section.

According to an aspect, the at least one bendable layer of the multi-sided wall is bent along a plurality of bend lines extending between the first and second ends of the multi-sided wall, such that the multi-sided wall of the heat spreader element comprises a plurality of facets when viewed in transverse cross section.

According to an aspect, the thermal management device further comprises one or more perforations through the multi-sided wall to permit flow of the cooling medium between the inner and outer surfaces of the multi-sided wall; wherein the perforations are provided along the bend lines.

According to an aspect, the thermal management device further comprises a plurality of upstanding fins which are provided along, and in thermal contact with, at least one of the inner and outer surfaces of the multi-sided wall of the heat spreader element; wherein the plurality of upstanding fins are arranged in a plurality of discrete groups, each discrete group of upstanding fins being provided on one of the facets of the multi-sided wall; and wherein the discrete groups of upstanding fins are spaced apart from one another by the bend lines and the perforations between the facets of the multi-sided wall.

According to an aspect, the bend lines between facets extend substantially longitudinally and at least one of the bend lines is pre-defined by perforating, scoring or notching the at least one bendable layer of the multi-sided wall along the bend line.

According to an aspect, the thermal management device further comprises a first flow space for a cooling medium provided along the inner surface of the heat spreader element, the first flow space having an inlet and an outlet which are spaced apart along the longitudinal axis; and a turbulence-enhancing insert provided in the first flow space; wherein the turbulence-enhancing insert comprises a plurality of corrugations arranged with openings through the corrugations being longitudinally oriented.

According to an aspect, the multi-sided wall of the heat spreader element is tubular, and the thermal management device further comprises a tubular inner sleeve spaced radially inwardly from the tubular wall of the heat spreader element, wherein the tubular inner sleeve includes a longitudinal wall portion with a hollow interior defining a second flow space for a cooling medium, and wherein the first flow space is defined between the longitudinal wall portion of the tubular inner shell and the tubular wall of the heat spreader element; wherein the corrugations of the turbulence-enhancing insert each have a top surface in thermal contact with the tubular wall of the heat spreader element, a bottom surface in thermal contact with the longitudinal wall portion of the tubular inner shell, and a radially-oriented side wall extending between the top and bottom surfaces.

According to an aspect, the thermal management device further comprises one or more heat-generating components located inside the longitudinal wall portion of the tubular inner shell; wherein the tubular inner shell further includes a transverse wall which extends across the inside of the longitudinal wall portion; and wherein the transverse wall is provided with one or more perforations to permit flow of the cooling medium through the second flow space.

According to an aspect, the plurality of electronic components comprises a plurality of light-emitting diodes (LEDs); wherein the thermal management device further comprises a fan unit located proximate to the first end or the second end of the multi-sided wall of the heat spreader element, the fan unit being adapted to circulate the cooling medium through the interior space of the heat spreader element; wherein the fan unit includes a temperature-responsive proportional speed control to maintain the LEDs at a specific temperature in order to maintain a specific color or light output.

According to an aspect, the plurality of electronic components comprises a plurality of light-emitting diodes (LEDs); and wherein the thermal management device further comprises a clear or translucent lens provided over the outer surface of the multi-sided wall of the heat spreader element and over the LEDs.

In accordance with an aspect of the present disclosure, there is provided a method of manufacturing a thermal management device as described herein. The method comprises: providing a flat metal substrate comprising the at least one bendable layer of the tubular wall; forming a plurality of bend lines on at least one of the inner and outer surfaces of the flat metal substrate, wherein the plurality of bend lines are formed by scoring, perforating or notching the flat metal substrate; and bending the flat metal substrate along the bend lines and forming the multi-sided heat spreader element, wherein the multi-sided heat spreader element comprises a plurality of facets, each of the facets being substantially flat and being defined between two bend lines.

According to an aspect, the method further comprises mounting the electronic components to the outer surface of the flat metal substrate before the step of bending the flat metal substrate.

In accordance with an aspect of the present disclosure, there is provided an LED device comprising a plurality of LEDs and a thermal management device for controlling temperature and wavelength of radiation emitted by the plurality of LEDs. The thermal management device comprises: (a) a multi-sided heat spreader element defining a longitudinal axis and comprising a longitudinally extending multi-sided wall and an internal space at least partly enclosed within the multi-sided wall, the multi-sided wall having an inner surface, an outer surface on which the LEDs are supported, and longitudinally spaced first and second ends; (b) at least one two-phase cooling element, wherein each two-phase cooling element is a vapor chamber or a heat pipe; wherein each of the at least one two-phase cooling elements is elongated along the longitudinal axis; wherein each of the at least one two-phase cooling elements includes an evaporation zone in thermal contact with one or more of the LEDs, and a condensation zone spaced from the LEDs along the longitudinal axis; (c) a flow space for a cooling medium provided in the internal space of the heat spreader element; and (d) a temperature-controlled fan unit adapted to circulate the cooling medium through the interior space of the heat spreader element, wherein the fan is operable to control a temperature and a wavelength of radiation emitted by the LEDs based on a temperature of at least one of the heat spreader element, the at least one two-phase cooling element, and the LEDs.

BRIEF DESCRIPTION OF THE DRAWINGS

Exemplary embodiments of the present disclosure will now be described, by way of example, with reference to the accompanying drawings, in which:

FIG. 3 is a cross-sectional view of the heat spreader element and the turbulence-enhancing insert of the thermal management device of FIG. 1;

FIG. 4 is a cross-sectional view of the inner sleeve of the thermal management device of FIG. 1;

FIG. 5A is an exploded view of the heat spreader element and a two-phase cooling element of the thermal management device of FIG. 1;

FIG. 5C is an exploded view of one of the two-phase cooling elements of the thermal management device of FIG. 1, and shows a variation in construction of the two-phase cooling elements;

FIG. 6 is a central longitudinal cross section through the thermal management device of FIG. 1;

DETAILED DESCRIPTION

Figure 1:
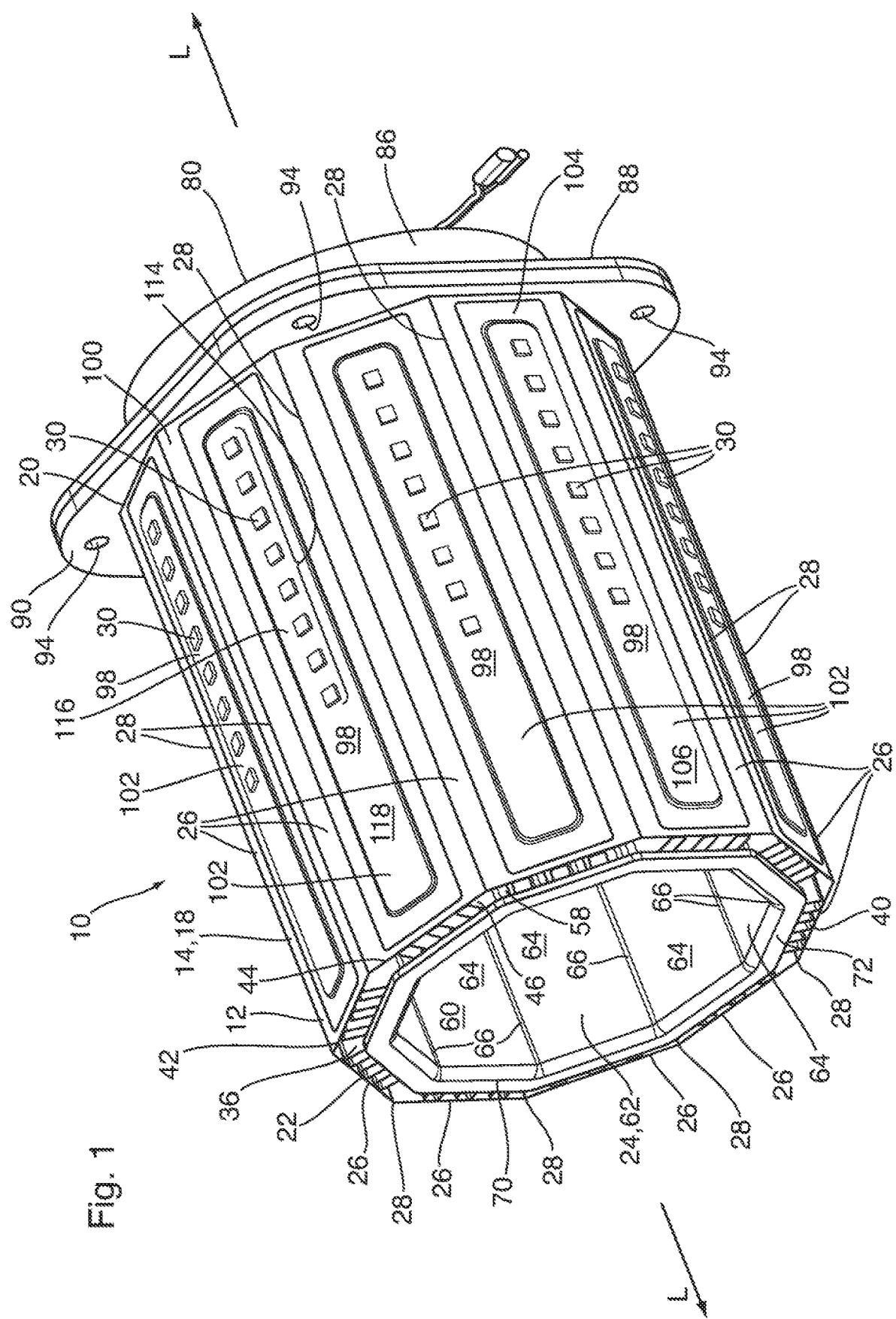
FIG. 1 is a perspective view of a thermal management device according to a first embodiment.
Figure 2:
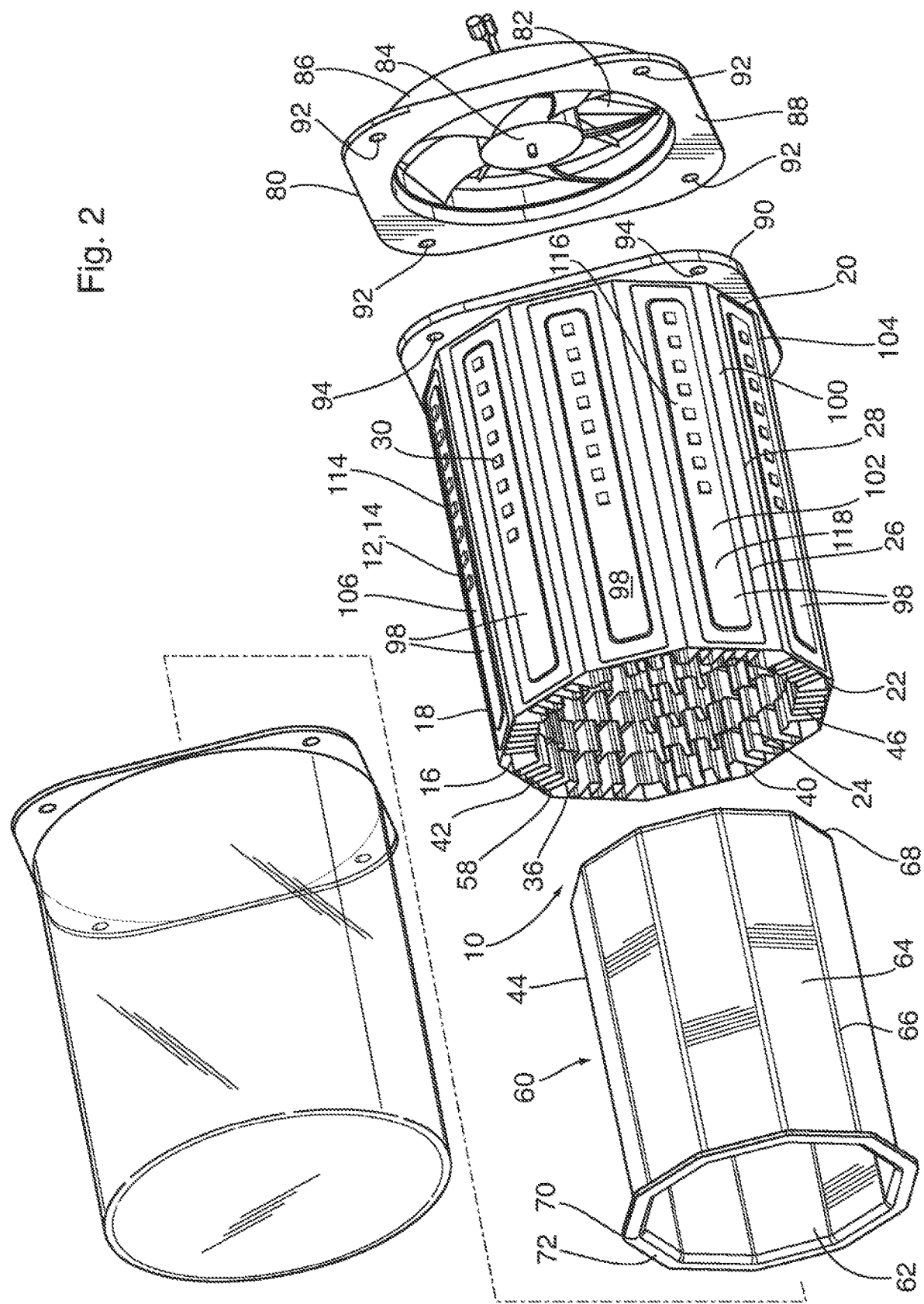
FIG. 2 is a partly disassembled perspective view of the thermal management device of FIG. 1.

A thermal management device 10 according to a first embodiment is now described below with reference to FIGS. 1 to 8.

Thermal management device 10 comprises a heat spreader element 12 having a multi-sided, non-linear configuration, and which is shown separated from other components of heat spreader element 12 in FIG. 3. The heat spreader element 12 comprises a multi-sided wall 14 which extends along longitudinal axis L (FIG. 1) and has an inner surface 16 and an outer surface 18. The heat spreader element 12 has longitudinally spaced first and second ends 20, 22 which, in the present embodiment, are open. Due to its multi-sided configuration, the wall 14 of heat spreader element 12 defines an open-ended enclosure at least partly surrounding an internal space 24. The multi-sided, non-linear heat spreader element 12 shown in the drawings has a wall 14 with a tubular shape, however, this is not essential. The multi-sided, non-linear shape of wall 14 may be partially open along its sides, such as a C-shape, U-shape, etc., whether the wall 14 is smooth or multi-faceted, as further described below.

The wall 14 of heat spreader element 12 has a plurality of facets 26 when viewed from the end or in transverse cross section, each of which may be substantially flat. There are a total of ten facets 26 making up the wall 14 of heat spreader element 12, the facets 26 comprising rectangles of substantially identical dimensions, such that the wall 14 defines a regular decagon when viewed in a transverse plane.

Although wall 14 has ten identical facets 26, this is not essential. The number and dimensions of the facets 26 will depend on a number of factors, as discussed further below. Where the wall 14 is multi-faceted, it will comprise at least three facets, wherein the upper limit on the number of facets is not particularly limited. In the present embodiment, longitudinal bends 28 are defined by bend lines between the facets 26, along which the wall 14 is bent. The longitudinal bends 28 are straight and extend between first and second ends 20 and 22, parallel to the longitudinal axis, such that the wall 14 has a constant diameter. However, it will be appreciated that the wall 14 is not necessarily of constant diameter and may for example be tapered, such that the sides of the facets 26 and bends 28 being angled relative to the longitudinal axis. For example, with a tapered wall 14, the heat spreader element 12 may have a conical or truncated conical shape, with the cone or truncated cone shaped wall 14 optionally comprising a plurality of flat, tapered facets 26.

In other embodiments, the wall 14 may be smoothly rounded, such that it defines a circle, oval or other rounded shape when viewed in a transverse plane.

In the present embodiment, the wall 14 may comprise at least one layer of a thermally conductive metal which may be bent or folded from a flat shape to the shape of the wall 14, by bending it along bends 28, which may be pre-defined in the sheet by perforating or scoring the sheet along the bend lines 28, as further described below. Accordingly, the wall 14 comprises at least one bendable layer to permit it to be rolled up and/or bent into tubular form.

A plurality of electronic components 30 are provided proximate to the outer surface of the wall 14 of heat spreader element 12. In the present embodiment, each of the electronic components 30 comprises a light emitting diode (LED). The LEDs 30 are in thermal contact with the outer surface of the wall 14, and may be directly mounted thereto, for example through a thermally conductive dielectric layer of thermal interface material (TIM) 32 (FIGS. 9, 16) and a circuit board 34 (FIGS. 9, 16), with each circuit board 34 carrying one or more LEDs 30. The LEDs 30 are spaced apart from one another across the outer surface 18 of wall 14, such that the thermal management device 10 forms part of an LED lamp. The number of LEDs 30 is selected so that the LED lamp will have a specific wattage and emit a predetermined amount of light. For example, the thermal management devices 10 described herein may have a wattage ranging from less than 100 watts to greater than 1000 watts. It will be appreciated that not every facet 26 necessarily carries one or more LEDs 30.

For example, the thermal management device 10 according to the present embodiment may be configured for a 240 watt LED lamp, each facet 26 having a sufficient number of LEDs 30 to provide a wattage of 24 watts. An LED lamp incorporating the thermal management device 10 may have a diameter of roughly 6 cm and a length of roughly 10 cm, with the LEDs 30 and the outer surface 18 of heat spreader element 12 being covered by a clear or translucent lens.

The LEDs 30 emit a significant amount of heat during use, and cooling is required in order to maintain the LEDs 30 at a temperature at which they will perform efficiently and with minimal degradation. For example, the thermal management device 10 may be configured to maintain the LEDs 30 at a temperature of about 105° C. or less. In the present embodiment, cooling is provided by circulating a cooling medium along the inner surface 16 of the wall 14, and optionally along the outer surface 18 of wall 14, wherein the cooling medium flows in a direction which is at least generally parallel to the longitudinal axis L. The circulating cooling medium is in contact with the inner and/or outer surfaces 16, 18 of wall 14, and may also be in direct contact with the LEDs 30, and absorbs heat generated by the LEDs 30.

The thermal management device 10 further comprises a flow space 36 for circulating the cooling medium along the inner surface 16 of the wall 14 of the heat spreader element 12. The flow space 36 may have an inlet 38 and an outlet 40 which are spaced apart along the longitudinal axis L. In the present embodiment, the inlet and outlet 38 and 40 have an annular or polygonal shape and are proximate to the first and second ends 20 and 22 of the heat spreader element 12.

The flow space 36 of thermal management device 10 is defined between an outer wall 42 and an inner wall 44, both of which have a tubular configuration, and is also referred to herein as the "first flow space". In the present embodiment the outer wall 42 of flow space 36 corresponds to the wall 14 of heat spreader element 12, and references to the outer wall 42 in the description of the present embodiment are equivalent to references to the wall 14 of heat spreader element 12, and vice versa. The inner wall 44 of flow space 36 is radially inwardly spaced from the outer wall 42.

Provided inside the flow space 36 of thermal management device 10 are a plurality of upstanding cooling fins in the form of a turbulence-enhancing insert 46, such as a corrugated fin or a turbulizer. As further described below, upstanding cooling fins may be provided on the inner and/or outer surfaces 20, 22 of the wall 14 of heat spreader element 12. The turbulence-enhancing insert 46, and upstanding cooling fins in general, increase the heat transfer surface area of the heat spreader element 12 and improve heat transfer from the thermal management device 10 to the cooling medium. The turbulence-enhancing insert 46 provides turbulence in the flow of the cooling medium, thereby enhancing heat transfer from the LEDs 30 to the cooling medium through the wall 14 of heat spreader element 12 (outer wall 42). The turbulence-enhancing insert 46 may enhance rigidity of the wall 14 of the heat spreader element 12 and the thermal management device 10. Also, the turbulence-enhancing insert 46 may separate the flow space 36 into a plurality of longitudinally extending fluid flow passages.

As used herein, the terms "fin" and "turbulizer" refer to corrugated turbulence-enhancing inserts 46 having a plurality of ridges or crests 48 connected by side walls 50, with the ridges 48 being rounded or flat. As defined herein, a "fin" has continuous ridges whereas a "turbulizer" has corrugations which are interrupted along their length to provide a tortuous flow path. Turbulizers are sometimes referred to as offset or lanced strip fins, and examples of such turbulizers are described in U.S. Pat. No. Re. 35,890 (So) and U.S. Pat. No. 6,273,183 (So et al.). The patents to So and So et al. are incorporated herein by reference in their entireties.

In thermal management device 10, the turbulence-enhancing insert 46 has flat ridges 48 and radially-extending (vertical) side walls 50, and comprises an offset strip fin in which the corrugations are interrupted along their (longitudinal) lengths, with adjacent portions of the corrugations being offset by about one-half the width of a corrugation. The insert 46 is oriented inside the space between outer and inner walls 42, 44 with its ridges 48 arranged parallel to the direction of flow of the cooling medium, such that the openings through the corrugations are longitudinally oriented. Each ridge 48 being in thermal contact with the inner surface of the outer or inner wall 42, 44. The ridges 48 of the turbulence-enhancing insert 46 may be metallurgically bonded to the inner surfaces of the outer and inner walls 42, 44, for example by brazing or soldering. Although a metallurgical bond is not necessary, it provides a good heat transfer path between the wall 14 of the heat spreader element 12 and the insert 46.

The turbulence-enhancing insert 46 may itself comprise a multi-faceted structure formed from a single sheet of metal. For example, the insert 46 may comprise a plurality of corrugated sections 52, each corresponding to one of the facets 26 of heat spreader element 12, with non-corrugated bend sections 54 being provided between adjacent corrugated sections 52. The insert 46 is initially in the form of a flat sheet formed with corrugations having ridges 48 and side walls 50, and is then bent along each of the bend sections 54 to form the multi-faceted structure shown in the drawings. Although not essential, the bend sections 54 can be provided with pre-defined, longitudinal bend lines, for example by perforating or scoring the sheet, to ensure that the bends in the insert 46 are radially aligned with the bends 28 in the wall 14 of the heat spreader element 12.

The turbulence-enhancing insert 46 has a length, along the longitudinal axis L, which is substantially the same as that of the wall 14 of heat spreader element 12, such that turbulent flow of the cooling medium is provided along substantially the entire length of the heat spreader element 12. Therefore, the turbulence-enhancing insert 46 has a first end 56 which is proximate to the first end 20 of heat spreader element 12, and a second end 58 which is proximate to the second end 22 of heat spreader element 12. In the present embodiment, the first and second ends 56, 58 of the turbulence-enhancing insert 46 are substantially longitudinally aligned with the first and second ends 20, 22 of the heat spreader element 12.

In the present embodiment, the inner wall 44 of flow space 36 comprises a tubular inner sleeve 60 having a hollow interior 62 and having a shape which corresponds to the shape of the wall 14 of the heat spreader element 12. In the present embodiment, the inner sleeve 60 has a longitudinal wall portion which comprises a number of facets 64 separated by a plurality of angles 66. The shape and number of facets 64 correspond to those of the heat spreader element 12, with the angles 66 being radially aligned with bend sections 54 of turbulence-enhancing insert 46 and with the bends 28 of the heat spreader element 12. Although not essential, the wall of inner sleeve 60 is shown in the drawings (for example FIG. 8) as having a thickness which is greater than that of the wall 14 and the turbulence-enhancing insert 46, to provide structural support for the thermal management device 10.

The longitudinal wall portion of inner sleeve 60 has a first end 68 and a second end 70, the first end 68 of inner sleeve 60 being proximate to the first ends 20, 56 of the heat spreader element 12 and the turbulence-enhancing insert 46, and the second end 70 of inner sleeve 60 being proximate to the second ends 22, 58 of the heat spreader element 12 and the turbulence-enhancing insert 46. In the present embodiment, the second end 70 of inner sleeve 60 is substantially longitudinally aligned with the second ends 22, 58 of the heat spreader element 12 and the turbulence-enhancing insert 46, and the second end 70 of inner sleeve 60 may be provided with a radially outwardly extending lip 72. The lip 72 may be multi-faceted, as shown in the drawings.

The outlet 40 of flow space 36 is defined as a multi-faceted, annular space at the second ends 22, 58, 70 of the wall 14, turbulence-enhancing insert 46 and inner sleeve 60. The outwardly-extending lip 72, where one is provided, defines the area of the annular opening comprising the outlet 40 of flow space 36. The lip 72 also assists in aligning the inner sleeve 60 relative to the turbulence-enhancing insert 46.

For reasons which will be explained below, the inner sleeve 60 is slightly shorter than the wall 14 of heat spreader element 12, such that the inlet 38 of flow space 36 is defined as a multi-faceted annular space between the first end 68 of the tubular inner sleeve 60 and the inner surface 16 of wall 14 of heat spreader element 12, with the first end 20 of heat spreader element 12 extending longitudinally beyond the inlet 38. In the present embodiment, the first end 56 of turbulence-enhancing insert 46 extends to the first end 20 of heat spreader element 12, however, it will be appreciated that the first end 56 of turbulence-enhancing insert 46 may instead terminate at or proximate to the first end 68 of the inner sleeve 60.

It can be seen from FIG. 4 that the inner sleeve 60 includes a transverse wall 74 extending across the hollow interior 62 of the longitudinal wall portion of inner sleeve 60. The transverse wall 74 may be located anywhere between the first and second ends 68, 70 of inner sleeve 60, however, in order to direct the cooling medium into the inlet 38 of flow space 36, the transverse wall 74 is located at the first end 68 of inner sleeve 60.

In the present embodiment, the transverse wall 74 is free of perforations, such that all of the cooling medium will enter the inlet 38 of flow space 36, and none of the cooling medium will flow through the hollow interior 62 of inner sleeve 60. In some embodiments, however, one or more heat-generating components may be located inside the hollow interior 62. For example, where the thermal management device 10 comprises part of an LED lamp, the electronic components 76 (shown in dotted lines in FIG. 6) for controlling the operation of the LEDs 30 may be located inside the hollow interior 62. In a typical LED lamp, these electronic components 76 are located in the base of the lamp, and may increase the length dimension of the lamp. Therefore, the incorporation of electronic components 76 into the hollow interior 62 may save space.

Where such heat-generating components are incorporated into the hollow interior 62 of inner sleeve 60, the transverse wall 74 may be provided with one or more perforations 78 (shown in FIG. 6) to permit the cooling medium to flow through the hollow interior 62 (also referred to herein as "second flow space") and cool the electronic components 76.

Although the transverse wall 74 is shown as being flat, this is not necessary. For example, the wall 74 may have a rounded or conical shape, being outwardly convex, in order to enhance flow of the cooling medium into the inlet 38 of the flow space 36.

In the present embodiment the cooling medium is gaseous, and may comprise ambient air. The thermal management device 10 therefore includes a fan unit 80 located proximate to the inlet or outlet 38, 40 of the flow space 36 to cause the cooling medium to flow through the flow space 36 at a flow velocity which is sufficient to maintain the LEDs 30 at a desired temperature.

The fan unit 80 of thermal management device 10 is located proximate to the first end 38 of flow space 36, and blows the gaseous cooling medium into the first end 38 of flow space 36. The fan unit 80 comprises a fan blade 82 driven by an electric motor 84, wherein the fan blade 82 and motor 84 may be mounted in a housing 86. The housing 86 includes a flat mounting flange 88 extending about the outer perimeter of the fan unit 80. The housing 86 and blade 82 of fan unit 80 may be comprised of plastic.

The first end 20 of heat spreader element 12 may be provided with a radially outwardly extending flat mounting flange 90, to which the mounting flange 88 of fan unit 80 may be secured. The mounting flanges 88, 90 may be provided with aligned openings 92, 94 to accept mechanical fasteners such as screws (not shown). The mounting flanges 88, 90 may also be used to secure the thermal management device to a lamp base (not shown).

It can be seen that the fan blade 82 is longitudinally spaced from the inlet 38 of flow space 36, such that the fan blade 82 is adapted to direct the flow of the cooling medium longitudinally toward the inlet 38. The transverse wall 74 of inner sleeve 60 directs the flow of the cooling medium radially outwardly into the inlet 38 of flow space 36. It can be seen from the drawings that the longitudinal gap between the first end 68 of inner sleeve 60 and the first end 20 of heat spreader element 12 provides a radially inwardly facing space 96 through which the cooling medium enters the flow space 36 of the thermal management device 10.

Although the thermal management device 10 includes a fan unit 80, it will be appreciated that a fan unit 80 may not be essential in all embodiments. For example, in some embodiments, the number of LEDs 30 may be such that natural convection of ambient air through device 10 will be sufficient to maintain the LEDs at an acceptable temperature. However, increasing the density and/or wattage of the LEDs 30 will increase the amount of heat generated, and forced air from a fan unit 80 may be required as the wattage increases. It will also be appreciated that the fan unit 80 may be controlled so that it is activated only when the temperature of the LEDs rises above a threshold level, or the fan unit 80 may have a proportional speed control to maintain the LEDs 30 at a specific temperature in order to maintain a specific color (i.e. wavelength and/or frequency) or light output.

As mentioned above, the plurality of electronic components 30 are provided proximate to the outer surface of the wall 14 of heat spreader element 12 and may comprise a plurality of LEDs which are in thermal contact with the outer surface 18 of the wall 14. The heat generated by the LEDs 30 is conducted to the wall 14 of heat spreader element 12, and throughout the area of wall 14. The heat is then transferred from the wall 14 to the turbulence-enhancing insert 46 and to the cooling medium circulated through the flow space 36.

In some embodiments, the wall 14 of heat spreader element 12 comprises a single bendable layer of a thermally conductive metal. Examples of such embodiments will be described further below. In the present embodiment, the wall 14 of heat spreader element 12 further comprises one or more two-phase cooling elements 98, each of which comprises a vapor chamber or a heat pipe. Each two-phase cooling element 98 may have a construction as disclosed in commonly assigned U.S. patent application Ser. No. 16/047,484, filed on Jul. 27, 2018, published on Jan. 31, 2019 as US 2019/0033006 A1, and entitled ULTRA THIN HEAT EXCHANGERS FOR THERMAL MANAGEMENT, incorporated herein by reference in its entirety. In this regard, each two-phase cooling element 98 is generally flat and planar and has a thickness ranging from about 200-2,000 micrometers. The single bendable layer of thermally conductive material may comprise a clad metal sheet, such as those disclosed in publication US 2019/0033006 A1.

Where the wall 14 of heat spreader element 12 comprises a plurality of facets 26, each of the two-phase cooling elements 98 may be defined along one of the facets 26, and may correspond in shape to the facets 26. To provide efficient cooling, the area of each two-phase cooling element 98 is maximized so as to cover as much of the area of each facet 26 as possible. For these reasons, and also to provide a flat substrate for mounting of the LEDs, the two-phase cooling elements 98 are thin and flat, and have substantially the same shape and area as the facets 26. Therefore, in the present embodiment, the two-phase cooling elements 98 are relatively thin and elongated along the longitudinal axis.

Figure 5B:
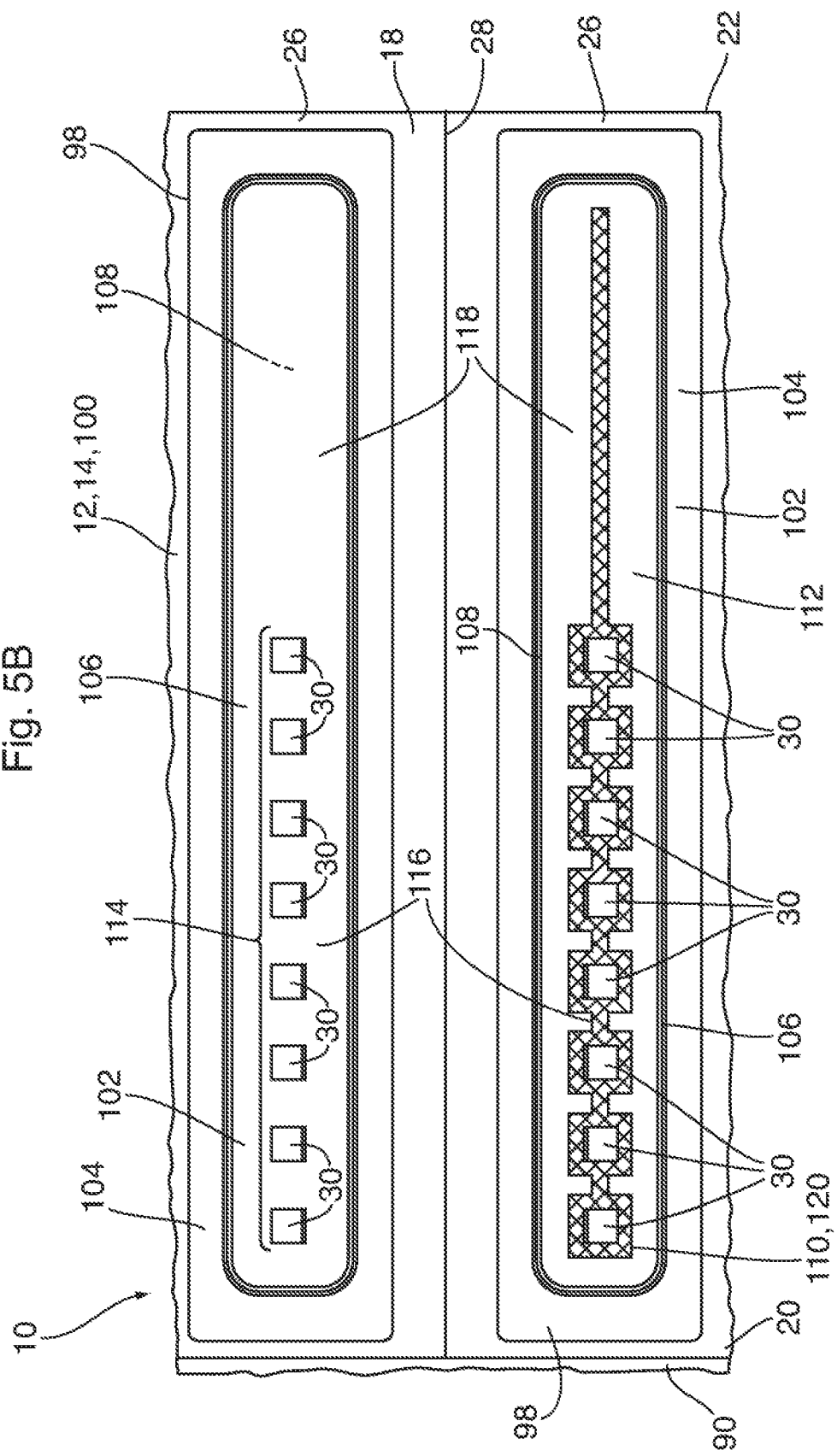
FIG. 5B is a close-up view of two facets of the thermal management device of FIG. 1.
Figure 7:
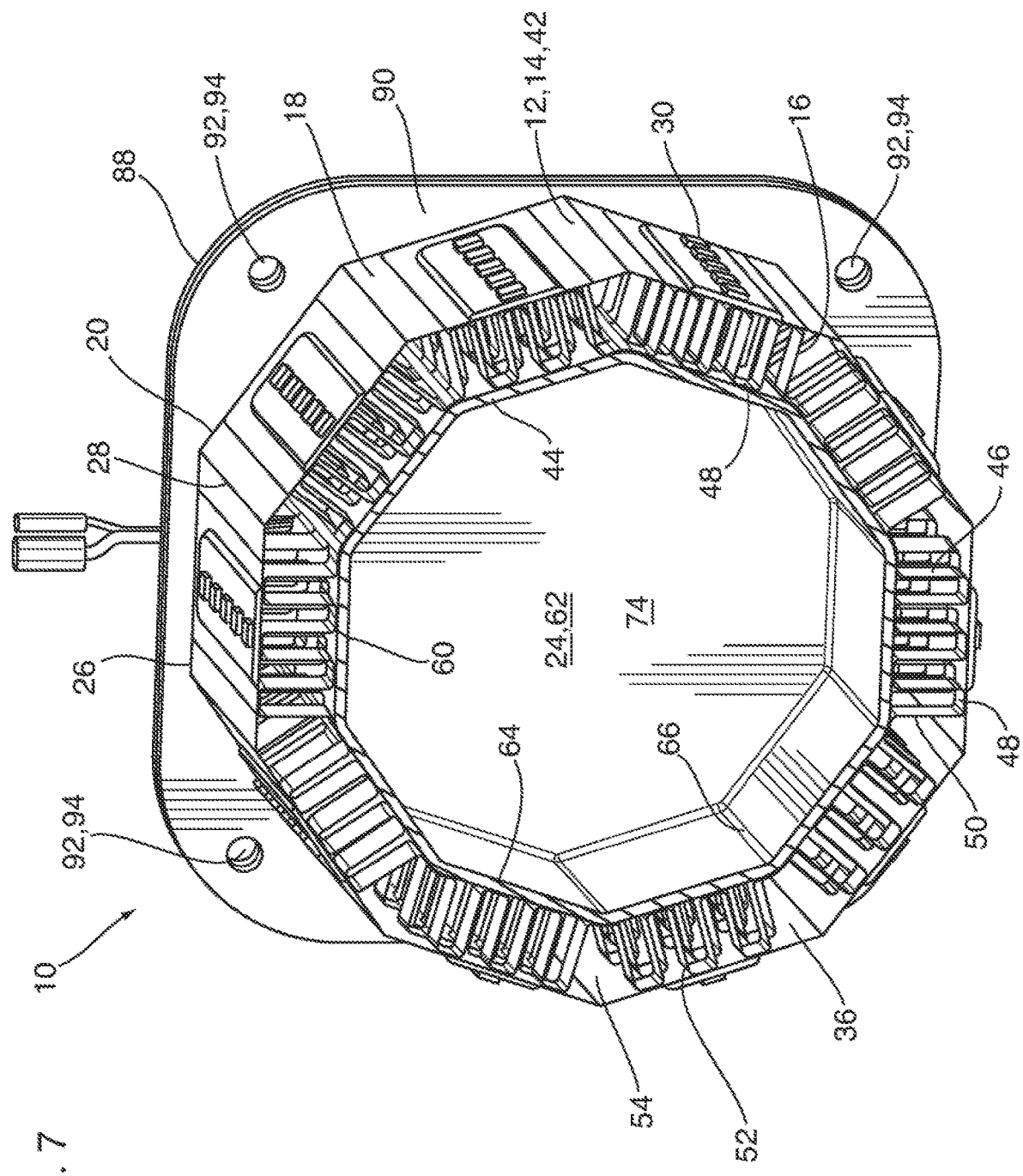
FIG. 7 is a transverse cross section view through the thermal management device of FIG. 1.
Figure 8:
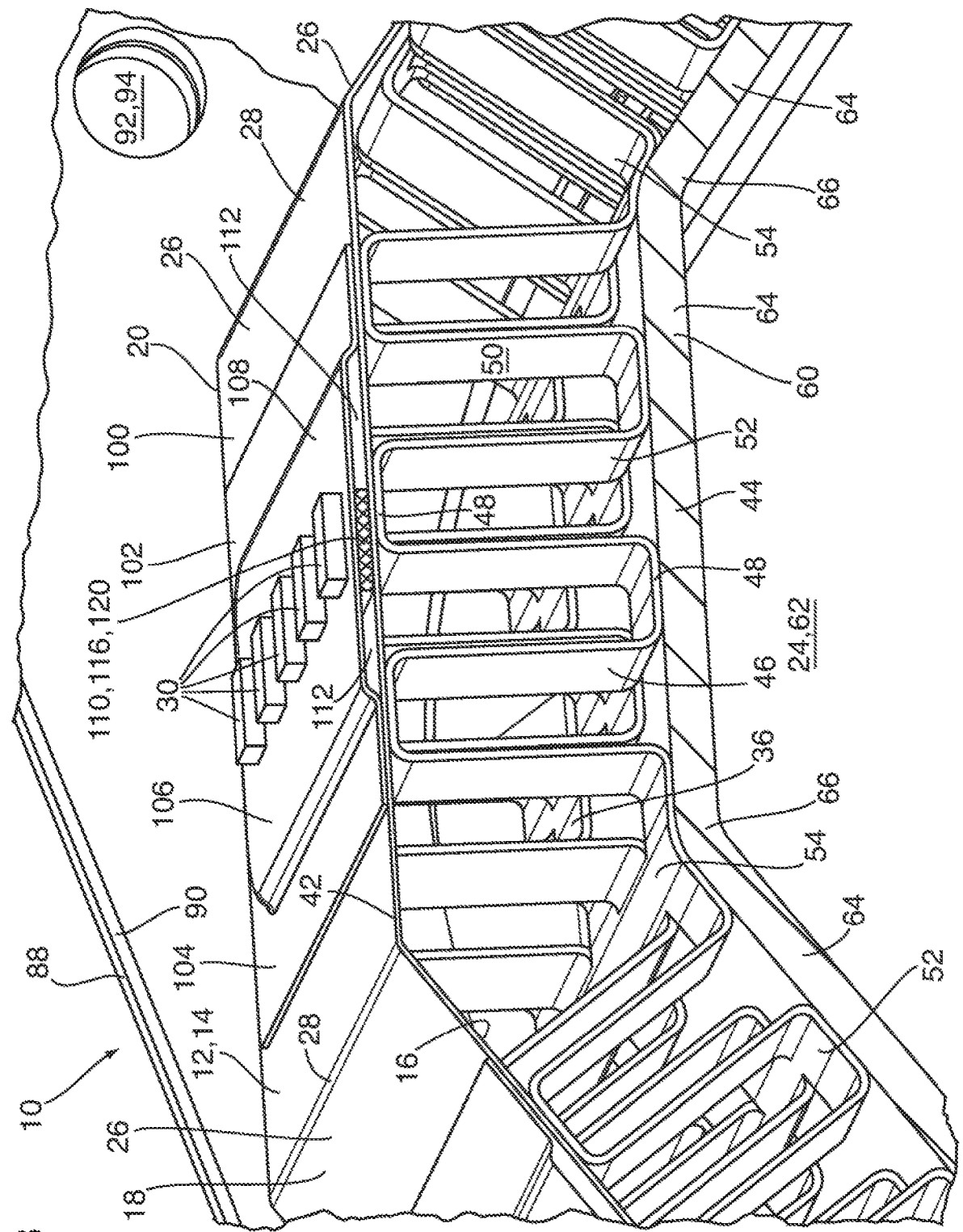
FIG. 8 is a partial, enlarged view of the cross section of FIG. 7.

As best seen in FIGS. 5A, 5B and 5C, the wall 14 of the heat spreader element 12 may have a two-layer or three-layer structure, depending on whether the two-phase cooling elements 98 are integrally formed with wall 14 or separately formed. In the two-layer construction, the wall 14 comprises a first sheet element 100 defining the bendable layer of thermally conductive metal, along which the inner surface 16 of wall 14 is defined. The first sheet element 100 defines all the facets 26 of the wall 14, and further defines the bends 28 between the facets 26.

The wall 14 of heat spreader element 12 further comprises a plurality of second sheet elements 102, each comprising a sheet of material shaped by stamping or the like. Each of the second sheet elements 102 has a shape and size substantially corresponding to the shape and size of one of the facets 26, having a flat flange 104 along its outer peripheral edges, along which the second sheet element 102 is sealingly joined to the first sheet element 100, for example by brazing or laser welding. Each of the second sheet elements 102 includes a flat, raised central portion 106 located inwardly of flange 104, with a chamber 108 (best seen in FIG. 8) being defined in the space between the raised central portion 106 of each second sheet element 102 and the first sheet element 100.

Each chamber 108 is thin and flat, and has an area substantially corresponding to an area of one of the facets 26, less the area of flange 104.

In the present embodiment, the first sheet element 100 comprises an integral, multi-faceted structure in which the bends 28 of wall 14 are provided. However, this is not essential. For example, in other embodiments the second sheet elements 102 may be integrated into a single, multi-faceted structure in the bends 28 of wall 14 are provided, between adjacent flanges 104. In such alternate embodiments, the first sheet element 100 may have the form shown in the drawings, being an integral, multi-faceted structure, or the first sheet element 100 may comprise a plurality of individual first sheet elements 100, each corresponding in size and shape to one of the facets 26 of wall 14. As another alternative, the second sheet elements 102 may be located on the inner surface of multi-faceted first sheet element 100, such that the second sheet elements 102 define the inner surface 16 of wall 14 and the first sheet element defines the outer surface 18 of wall 14.

According to the three-layer construction, shown in FIG. 5D, each of the two-phase cooling elements 98 is defined by a pair of opposed inner and outer sheet elements 100, 102 enclosing the chamber 108. Each sheet element 100, 102 corresponds in size and shape to one of the facets 26 of wall 14, and the bendable layer of wall 14 is defined as a separate multi-faceted structure 100'. The separately-formed two-phase cooling elements 98 may be attached to the wall 14 by metallurgical bonding, such as brazing, welding or soldering.

As disclosed in above-mentioned publication US 2019/0033006 A1, the first and second sheet elements 100, 102 may be comprised of stainless steel and may be clad on one or both sides with a lower melting metal which is inert to the working fluid, such as copper or nickel. The first and second sheet elements 100, 102 may be metallurgically bonded together by welding, including laser welding as disclosed in publication US 2019/0033006 A1.

In a specific embodiment, the outer surfaces of the first and second sheet elements 100, 102 (the surfaces facing away from chamber 108) may include a cladding which is different from the cladding of the inner surfaces of sheet elements 100, 102 (the surfaces facing into chamber 108). For example, the outer surfaces of the first and second sheet elements may be clad with an aluminum brazing alloy, to allow aluminum upstanding fins or turbulence-enhancing inserts to be brazed to the sheet elements 100, 102. Such brazing would take place before the sheet elements 100, 102 are welded together to seal the chamber 108.

The chamber 108 contains a working fluid such as water, and the chamber 108 also contains a sheet of wick material 110 which may comprise a metal wire mesh. As best seen in FIGS. 5B and 5C, the wick material 110 defines one or more liquid flow passages, and may include a plurality of cutouts defining one or more gas flow passages 112. In the present embodiment, the wick material 110 is elongate and extends along substantially the entire length of chamber 108, thereby defining one or more elongate liquid flow passages 120. Cutout areas surrounding the outer edges of the wick material 110 define the one or more elongate gas flow passages 112. Therefore, the shape of the wick material 110 promotes a longitudinal circulation of vaporized working fluid away from the LEDs 30, along the length of the two-phase cooling element 98, and a longitudinal return circulation of condensed working fluid toward the LEDs 30.

In the present embodiment, the LEDs 30 are arranged in a plurality of linear arrays 114, each linear array 114 being provided on one of the facets 26 of the heat spreader element 12. However, the arrangement of LEDs 30 may vary according to a number of factors, including the shape and dimensions of the heat spreader element 12, the shape and dimensions of the facets 26, the dimensions of the LEDs 30, and the desired pattern of LEDs 30 on the outer surface 18 of heat spreader element 12.

Each of the two-phase cooling elements 98 includes at least one evaporation zone 116 and at least one condensation zone 118. Each of the LEDs 30 is in thermal contact with one of the evaporation zones 116. In the present embodiment, the evaporation zone 116 corresponds to portions of outer surface 18 on which the LEDs 30 are mounted, and the condensation zone 118 is spaced away from the LEDs 30 along the outer surface 18. For example, it can be seen from the drawings that each of the linear arrays 114 of LEDs 30 covers a portion of one of the facets 26, and extends from a point proximate to the first end 20 of heat spreader element 12, to a point located intermediate between the first and second ends 20, 22. The portion of the chamber 108 of each cooling element 98 which directly underlies an array 114 of LEDs 30 defines the approximate area of the evaporation zone 116, in which the liquid working fluid in the wick material 110 is evaporated by heat emitted by the LEDs 30. The condensation zone 118 is defined as the approximate area of the chamber 108 of each cooling element 98 extending from the evaporation zone 116 to a point proximate to the second end 22 of the heat spreader element 12. Although the two-phase cooling elements 98 of this embodiment have a single evaporation zone 116 and a single condensation zone 118, this is not essential. For example, the array 114 of LEDs 30 may be located between the ends 20, 22 of heat spreader element 12, such that the two-phase cooling elements 98 include an evaporation zone 116 located between two condensation zones 118 located at opposite ends 20, 22 of the heat spreader element 12.

As shown in FIGS. 5B and 5C, the wick material 110 extends through both the evaporation zone 116 and the condensation zone 118. In the evaporation zone 116, the working fluid is heated and vaporized, thereby absorbing heat energy from the LEDs 30. The wick material 110 in the evaporation zone 116 may include an increased edge surface area to enhance the transfer of gaseous working fluid from the wick material 110 (i.e. the one or more liquid flow passages 120) to the one or more gas flow passages 112. For example, the wick material 110 includes castellations 113 to increase its edge surface area in the evaporation zone 116, although other shapes may be effective, including sinusoidal, triangular, etc.

The vaporized working fluid flows through the one or more gas flow passages 112 toward the condensation zone 118. The vaporized working fluid condenses in the condensation zone 118, releasing heat energy and thereby spreading the heat throughout the area of the two-phase cooling element 98, and throughout the area of each facet 26. The wick material 110 is hydrophilic and includes a large number of small voids within which capillary forces are generated. The condensed fluid in the condensation zone 118 is drawn into these voids and is circulated back to the evaporation zone 116 through the wick material 110, which defines one or more liquid flow passages 120, as shown in FIGS. 5B and 5C.

One benefit of incorporating two-phase cooling elements 98 into thermal management device 10 is that the temperature differential between different LEDs 30 within each of the arrays is minimized, and may be close to zero. In the absence of two-phase cooling, one would expect the LEDs 30 in the central areas of each array to be hotter than those located near the edges of the arrays. Because the frequency and wavelength of light emitted by the LEDs 30 are dependent on temperature, maintaining all the LEDs 30 within a narrow temperature range will narrow the frequency and wavelength range of the radiation emitted by the LEDs 30. This can be beneficial in applications where an LED device is required to provide a specific frequency and/or wavelength of radiation, for example in greenhouse applications and/or in radiation curing applications.

Although two-phase cooling elements 98 produce the above-mentioned temperature uniformity in the absence of fan cooling, additional benefits can be realized by incorporating two-phase cooling elements 98 into thermal management device 10, in combination with a temperature controlled fan unit 80 as described above. The fan unit 80 is operable to vary the rate of coolant medium flow, by intermittent operation and/or speed control, in response to a temperature signal representing the temperature of the LEDs 30. By varying the flow of the cooling medium, the fan unit 80 alters the heat transfer coefficient of any upstanding cooling fins incorporated in the device 10 to conduct and radiate heat away from the wall 14. By doing this, the fan unit 80 can be controlled to vary the temperature of the LEDs 30, all while maintaining the temperature differential within each array of LEDs 30 at or near zero. For example, the fan unit 80 may include a temperature-responsive proportional speed control, wherein the control is a feedback control based on the temperature of wall 14, the two-phase cooling elements 98, and/or the LEDs 30. Because the two-phase cooling elements maintain the LEDs 30 at a constant temperature, the temperature can be monitored at a single point along the length of the wall 14. Therefore, a thermal management unit 10 including two-phase cooling elements 98 in combination with a temperature-controlled fan unit 80 provides the LEDs 30 with overall temperature uniformity and temperature variability, allowing the same LED device to provide a range of specific wavelengths, depending on the specific application.

A thermal management device 130 according to a second embodiment is now described below with reference to FIGS. 9 to 10.

Most of the elements of thermal management device 130 are similar or identical to the elements of thermal management device 10 described above. Like elements of device 130 are identified with like reference numerals in the drawings and/or in the following description, and the above descriptions of the like elements for device 10 applies equally to device 130. The following description of device 130 therefore focuses primarily on the differences between thermal management devices 10 and 130.

Figure 9:
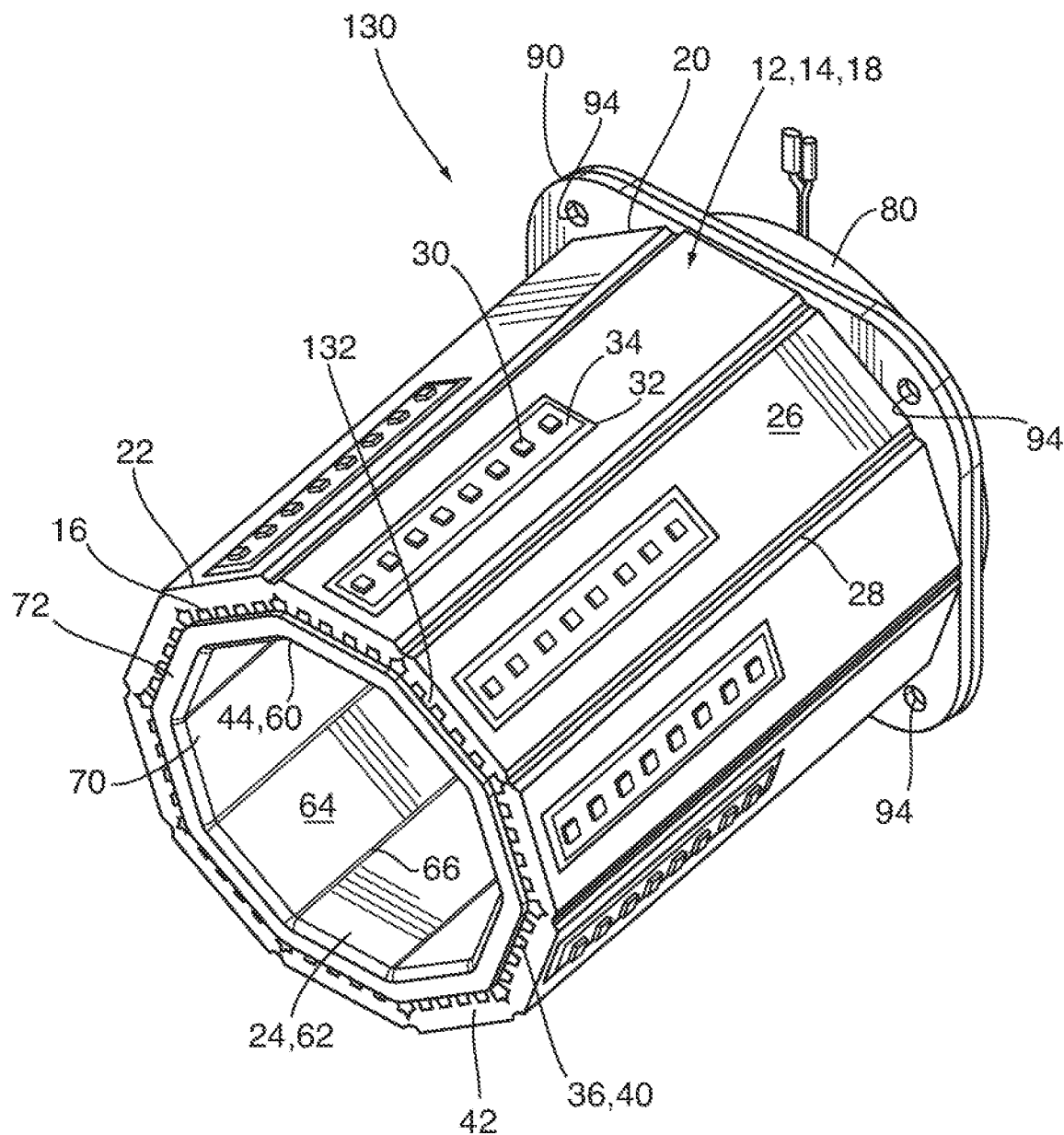
FIG. 9 is a perspective view of a thermal management device according to a second embodiment.
Figure 10:
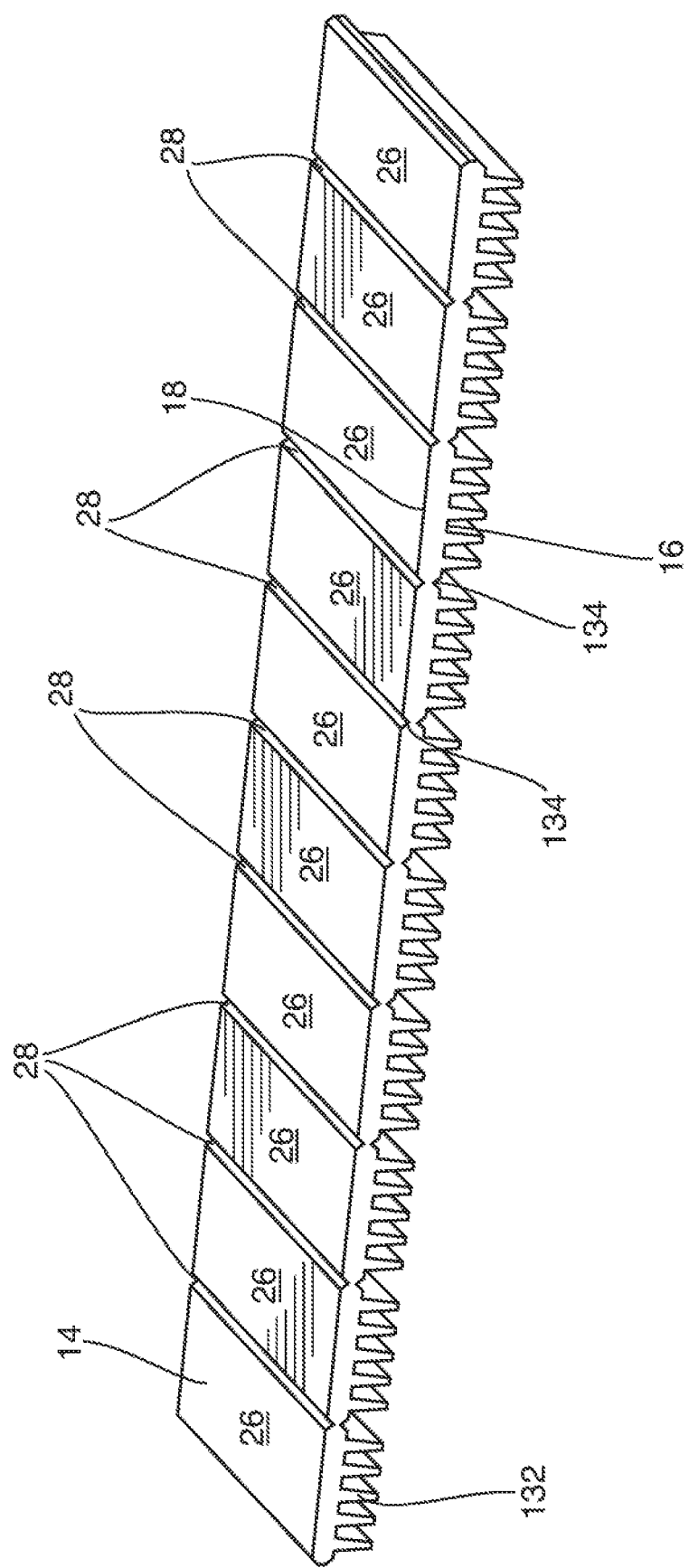
FIG. 10 is a perspective view of the heat spreader element of the second embodiment, shown in flattened form.

FIG. 9 shows the complete thermal management device 130, and FIG. 10 shows the heat spreader element 12 thereof in flattened form.

The inner sleeve 60 and the fan unit 80 of the thermal management device 130 are identical to those of thermal management device 10, and further description of these elements is omitted. The electronic components 30 of thermal management device 130 are LEDs 30 arranged in linear array 114 as in thermal management device 10. However, FIG. 9 also shows the circuit boards 34 on which the LEDs 30 are mounted, and the TIM layer 32 which forms a thermally conductive dielectric layer between LEDs 30 and the outer surface 18 of heat spreader element 12. Although not shown in FIGS. 1-8, it will be appreciated that identical TIM layers 32 and circuit boards 34 may be provided in thermal management device 10.

Instead of being arranged closer to the first end 20 of heat spreader element 12, the linear arrays 114 of LEDs are shown as being located toward the second end 22 thereof. However, this is not necessary, and LEDs 30 may be located anywhere and in any arrangement on the outer surface 18 of heat spreader element 12.

Instead of being constructed from first and second sheet elements 100, 102, the heat spreader element 12 is a relatively thick monolithic plate structure in which the wall 14 has a thickness greater than that of sheet elements 100, 102 of thermal management device 10. In some embodiments, the wall 14 of the heat spreader element 12 of device 130 may have a thickness of 2-3 mm. Therefore, in device 130, the heat spreader element 12 comprises a heat sink which absorbs and dissipates heat of the LEDs 30 throughout its area and thickness.

Instead of having a turbulence-enhancing insert as described above, the inner surface 16 of wall 14 is provided with a plurality of upstanding, longitudinally extending cooling fins 132 which are parallel to one another, wherein the cooling fins are located in the flow space 36 between the inner surface 18 of wall 14 and the inner sleeve 60. The cooling fins 132 may be integral with wall 14, with the wall 14 and cooling fins 132 being integrally formed by casting, extrusion and/or machining. The cooling fins 132 absorb heat from the wall 14 by conduction and then release heat to the cooling medium by convection. The cooling fins 132 extend along the length of the inner surface of wall 14 and, in some embodiments, may have a height of about 4-15 mm.

The free ends of the cooling fins 132 are proximate or in contact with the inner sleeve 60.

FIG. 10 shows the wall 14 (with cooling fins 132) in flattened form, with the facets 26 joined together along bend lines 28. In the present embodiment, the bend lines 28 are defined by V-shaped notches 134 in one or both of the inner and outer surfaces 16, 18 of the wall 14. In the present embodiment, The bend lines 28 are formed by opposed V-shaped notches 134 in both the inner and outer surfaces 16, 18. These notches 134 can be formed by scoring, machining, extruding or casting. When the wall 14 is folded to form the multi-faceted structure of FIG. 9, the notches 134 on the inner surface 16 of wall 14 will at least partially close. In other embodiments, it will be appreciated that the flattened wall 14 could serve as a heat spreader element 12 without being folded, for example where the final product is a lighting panel or the like. In such an embodiment the wall is not necessarily provided with bend lines 28.

Figure 11:
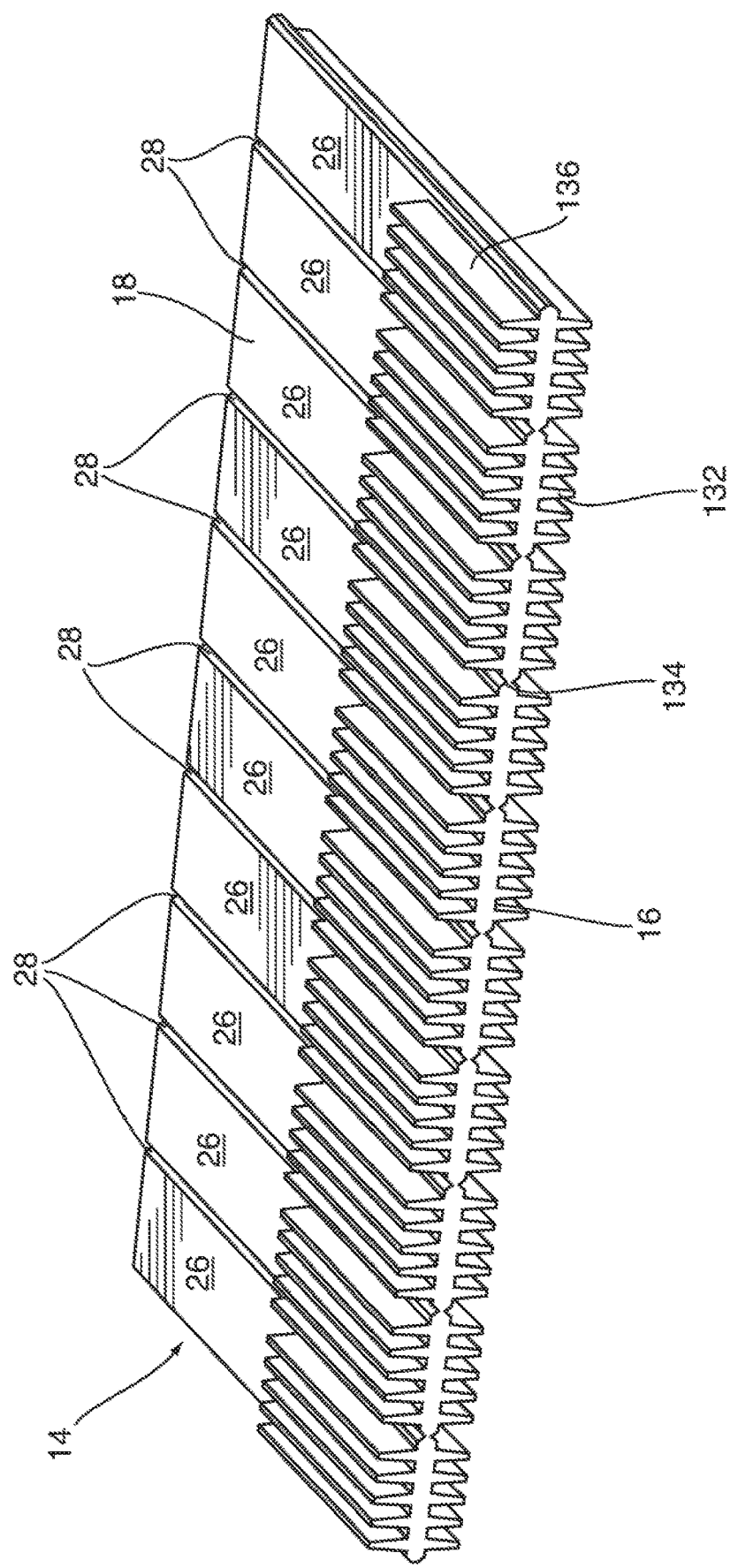
FIG. 11 is a perspective view of an alternate heat spreader element, shown in flattened form.

FIG. 11 shows an alternate form of wall 14 which may be used in the thermal management device 130 of the second embodiment. The wall 14 of FIG. 11 is identical to that shown in FIG. 10, with V-shaped notches 134 provided in at least the outer surface 18 of wall 14, and optionally in the inner surface 16, and with cooling fins 132 provided along the entire length of the inner surface 16 of wall 14.

In addition, the outer surface 18 of wall 14 is provided with a plurality of upstanding, longitudinally extending external cooling fins 136 which are parallel to one another and which may be integrally formed with wall 14 in the same manner as cooling fins 132 described above. The external cooling fins 136 conduct heat away from the outer surface 18 of wall 14 and transfer it to the ambient atmosphere by convection. The location of the external cooling fins 136 is limited to portions of the outer surface 18 of wall 14 which are not occupied by LEDs 30. For example, in the present embodiment, the external cooling fins 136 are located proximate to the first end 20 of heat spreader element 12, since the linear arrays 114 of LEDs are located toward the second end 22. However, as explained above, the LEDs 30 may be located anywhere and in any arrangement on the outer surface 18 of heat spreader element 12, and therefore the external cooling fins 136 can be located in other areas of outer surface 18.

Figure 12:
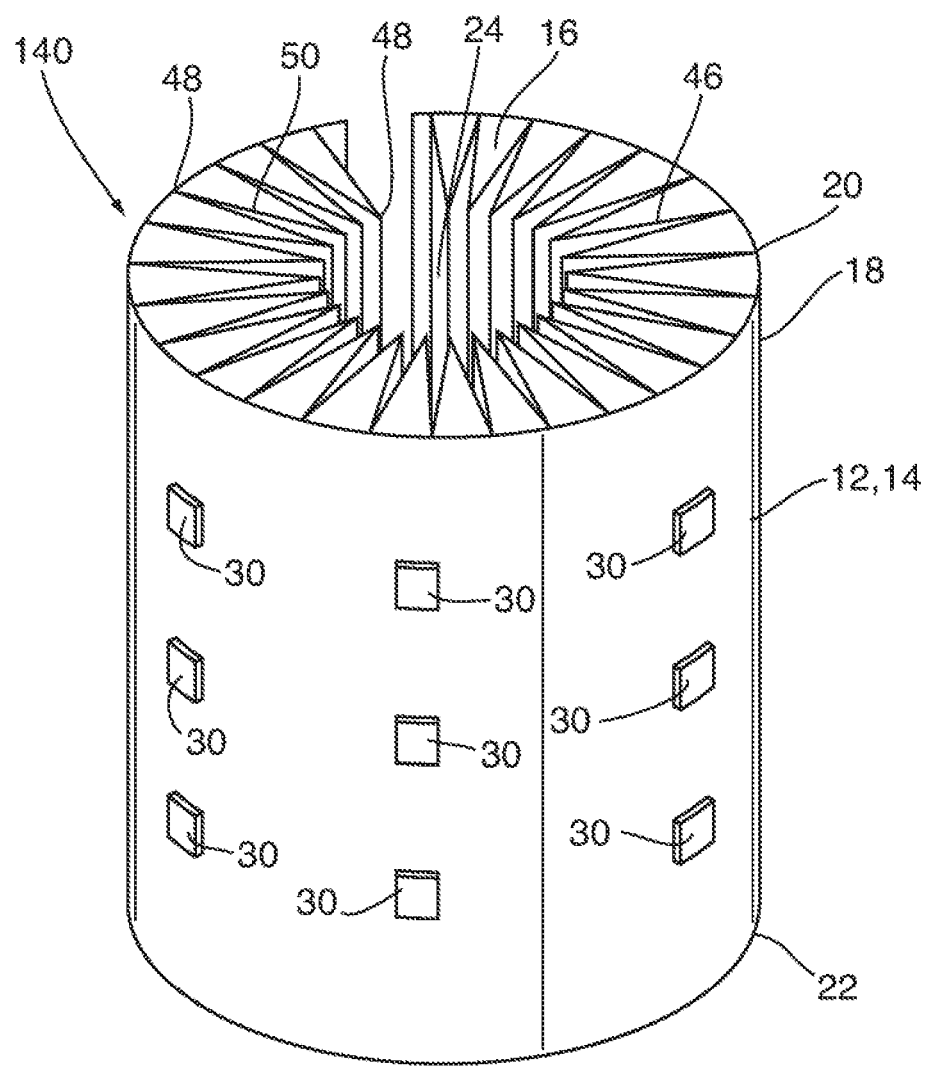
FIG. 12 is a perspective view of a thermal management device according to a third embodiment.

A thermal management device 140 according to a third embodiment is now described below with reference to FIG. 12.

A number of the elements of thermal management device 140 are similar or identical to the elements of thermal management device 10 described above. Like elements of device 140 are identified with like reference numerals in the drawings and/or in the following description, and the above descriptions of the like elements for device 10 applies equally to device 140. The following description of device 140 therefore focuses primarily on the differences between thermal management devices 10 and 140.

Instead of having a multi-faceted construction, the heat spreader element 12 of device 140 has a smoothly curved wall 14 with a smoothly rounded shape when viewed in transverse cross section. For example, the wall 14 may have a cylindrical shape and a circular cross-section, and comprises the bendable layer of the heat spreader element 12. In the present embodiment, the wall 14 has no pre-formed bend lines, and is smoothly bendable along any longitudinal line extending between the first and second ends 20, 22. The inner surface 16 of wall 14 is provided with a turbulence-enhancing insert 46 comprising a corrugated fin, with one set of ridges 48 being in contact with the inner surface 16 of wall 14, and optionally being metallurgically bonded thereto. To manufacture such a heat spreader element 12, the wall 14 and turbulence-enhancing insert 46 may be assembled in flat form, and then rolled or smoothly bent into a cylindrical shape, with its longitudinal side edges being overlapped and secured mechanically or by a metallurgical bond. Although the thermal management device 140 is illustrated without an inner sleeve, it will be appreciated that an inner sleeve such as sleeve 60 described above may be inserted into the hollow interior of the cylindrical structure.

It will be appreciated that the wall 14 of thermal management device 140 may comprise a single bendable layer of sheet material, or it may comprise one or more two-phase cooling elements 98 comprising at least one first sheet element 100 and at least one second sheet element 102.

Figure 14:
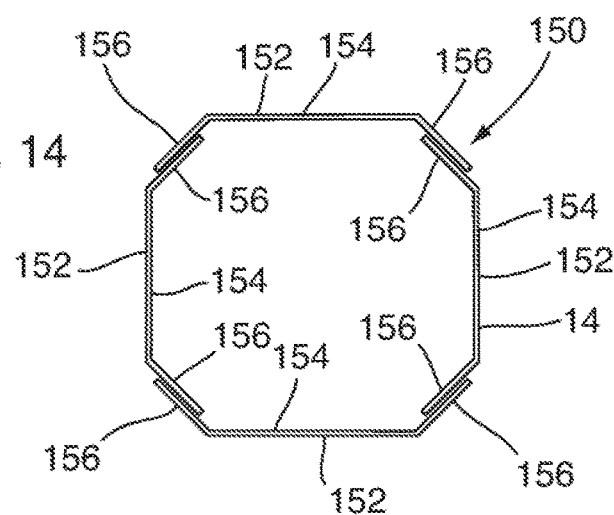
FIG. 14 is a partial end view of the thermal management device of FIG. 13.
Figure 15:
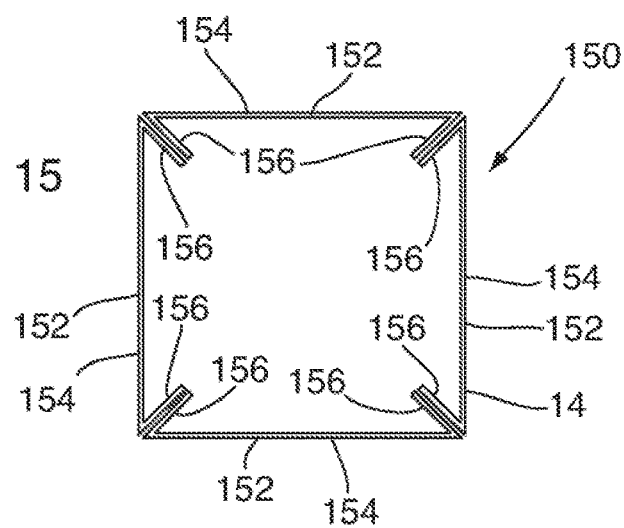
FIG. 15 is a partial end view of an alternate thermal management device of FIG. 13.

A thermal management device 150 according to a fourth embodiment is now described below with reference to FIGS. 13 to 15.

A number of the elements of thermal management device 150 are similar or identical to the elements of thermal management devices 10 and/or 130 described above. Like elements of device 150 are identified with like reference numerals in the drawings and/or in the following description, and the above descriptions of the like elements for devices 10 and 130 apply equally to device 150. The following description of device 150 therefore focuses primarily on the differences between thermal management device 150 and previously described devices 10 and 130.

Figure 13:
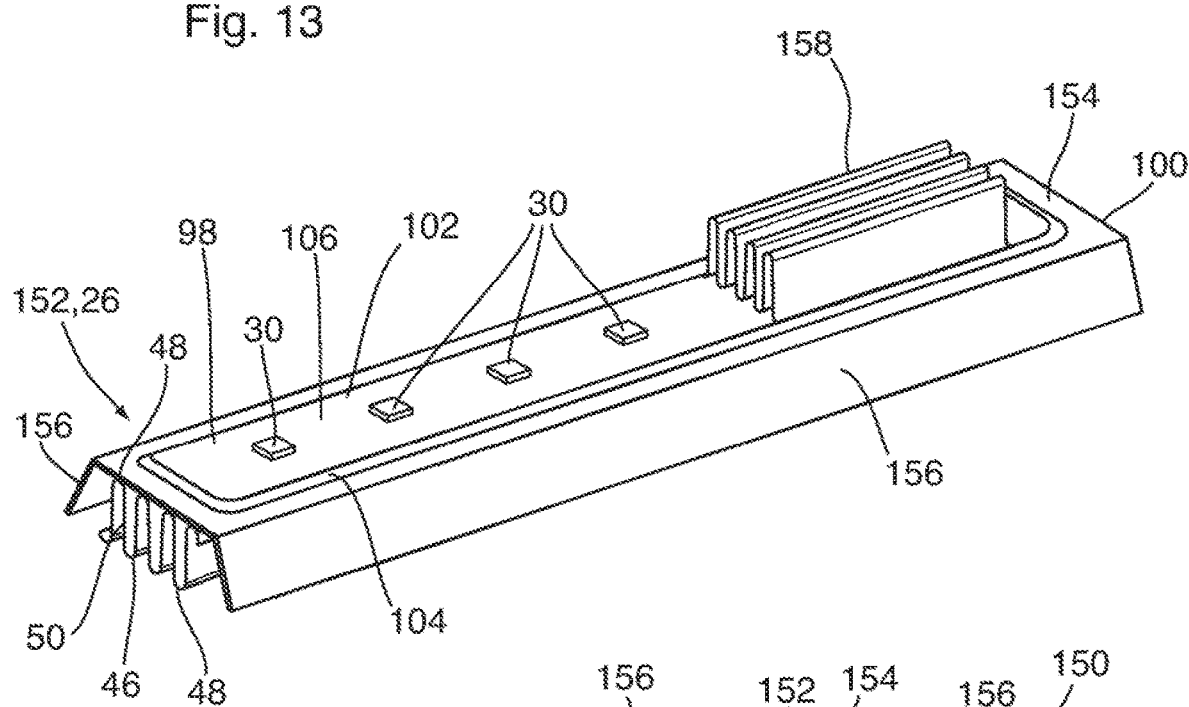
FIG. 13 is a perspective view of a thermal management device according to a fourth embodiment.

The thermal management device 150 is comprised of a plurality of segments 152, one of which is shown in FIG. 13. The segment 152 comprises one of the facets 26 of a multi-faceted wall 14, and comprises a first sheet element 100 and a second sheet element 102 which together form a two-phase cooling element 98 having an internal chamber 108 (not shown). The first sheet element 100 includes a flat central portion 154 with bendable flanges 156 being provided along both longitudinal side edges of the flat central portion 154. The second sheet elements 102 of the multi-faceted wall 14 may be identical to those of device 10.

The first sheet element 100 defines the inner surface 16 of wall 14, and is provided with upstanding fins in the form of an inner turbulence-enhancing insert 46 comprising a corrugated fin, with one set of ridges 48 being in contact with the inner surface of flat central portion 154, and optionally being metallurgically bonded thereto. This inner turbulence-enhancing insert 46 extends along the entire length of the segment 152. The inner turbulence-enhancing insert 46 is provided only over the inner surface of flat central portion 154, and not over the flanges 156.

Similar to devices 10 and 130 described above, the LEDs 30 are arranged at one end of the segment 152 of wall 14. The other end of segment 152 may be provided with outer upstanding fins or a turbulence-enhancing insert 158 which is in thermal contact with, and may be metallurgically bonded to, the outer surface of flat central portion 154, defined by the raised central portion 106 of the second sheet element 102.

After each individual segment 152 is assembled, a plurality of segments 152 are joined together along their bendable longitudinal flanges 156, either metallurgically or mechanically. It will be appreciated that three or more segments 152 may be combined to provide a multi-faceted thermal management device 150 having three or more facets. FIGS. 14 and 15 schematically show end views of four-faceted thermal management devices 150, wherein the embodiment of FIG. 14 has chamfered corners comprising overlapping flanges 156, and the embodiment of FIG. 15 has right angled corners due to the folding of the flanges 156 under the flat central portion 154. It will be appreciated that the same segments 152 may be used to provide thermal management device 150 with any number of facets 26, with the minimum number of facets 26 being three.

Figure 16:
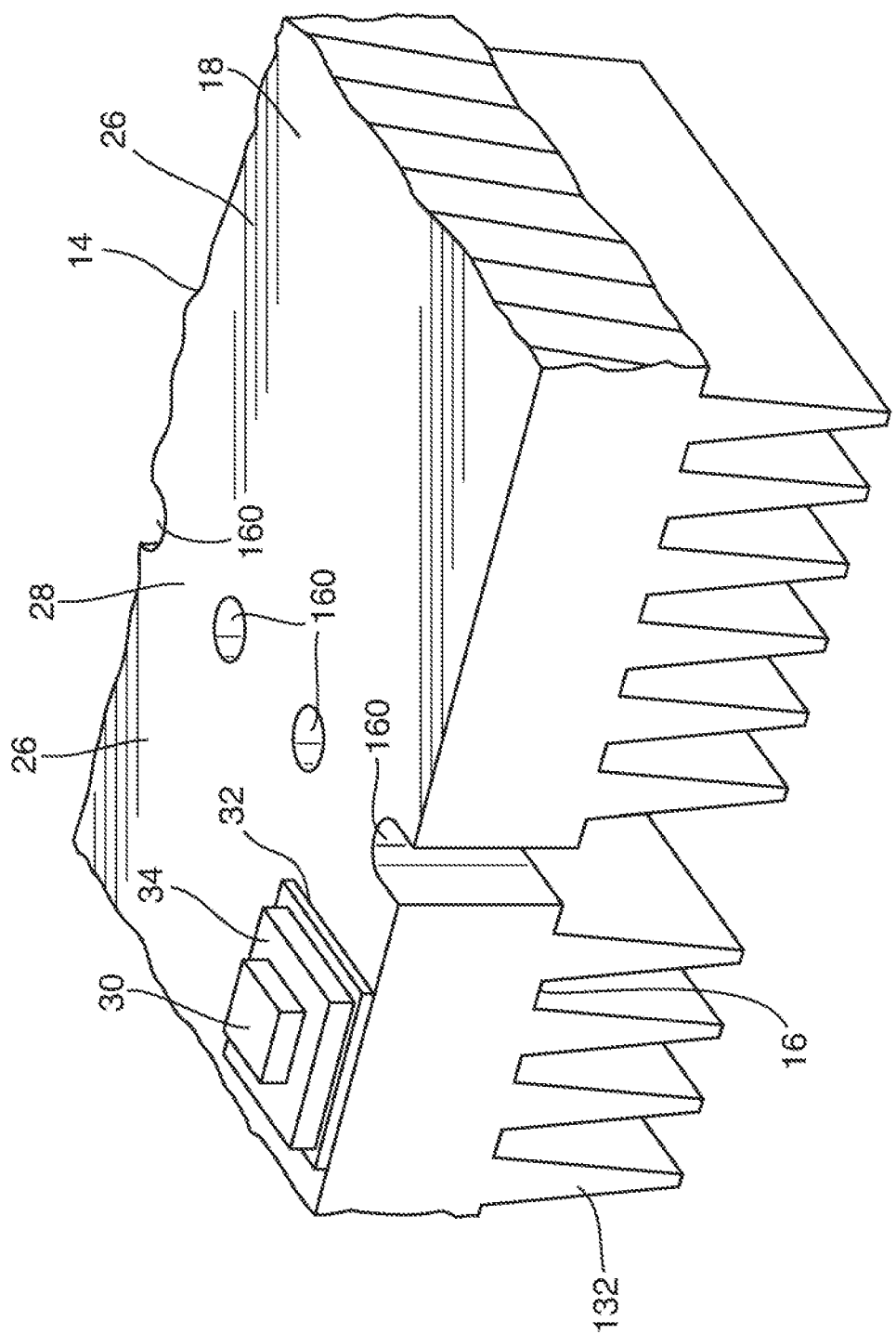
FIG. 16 is a perspective view of a heat spreader element, showing alternate types of joints and the mounting of the LEDs on the outer surface thereof.

FIG. 16 illustrates a portion of a flattened wall 14 similar to that shown in FIG. 10, partly in cross section, showing the layering of the LEDs 30, the circuit board 34 and the TIM layer 32, and also showing how the wall 14 may be perforated by perforations 160 to permit bending of the flattened wall 14 into a multi-faceted structure, such that the perforations 160 define the bend line 28 between adjacent facets 26.

A thermal management device 170 according to a fifth embodiment is now described below with reference to FIGS. 17 and 18.

A number of the elements of thermal management device 170 are similar or identical to the elements of thermal management devices 10, 130, 140 and/or 150 described above. Like elements of device 170 are identified with like reference numerals in the drawings and/or in the following description, and the above descriptions of these like elements apply equally to device 170. The following description of device 170 therefore focuses primarily on the differences between thermal management device 170 and previously described embodiments.

Figure 17:
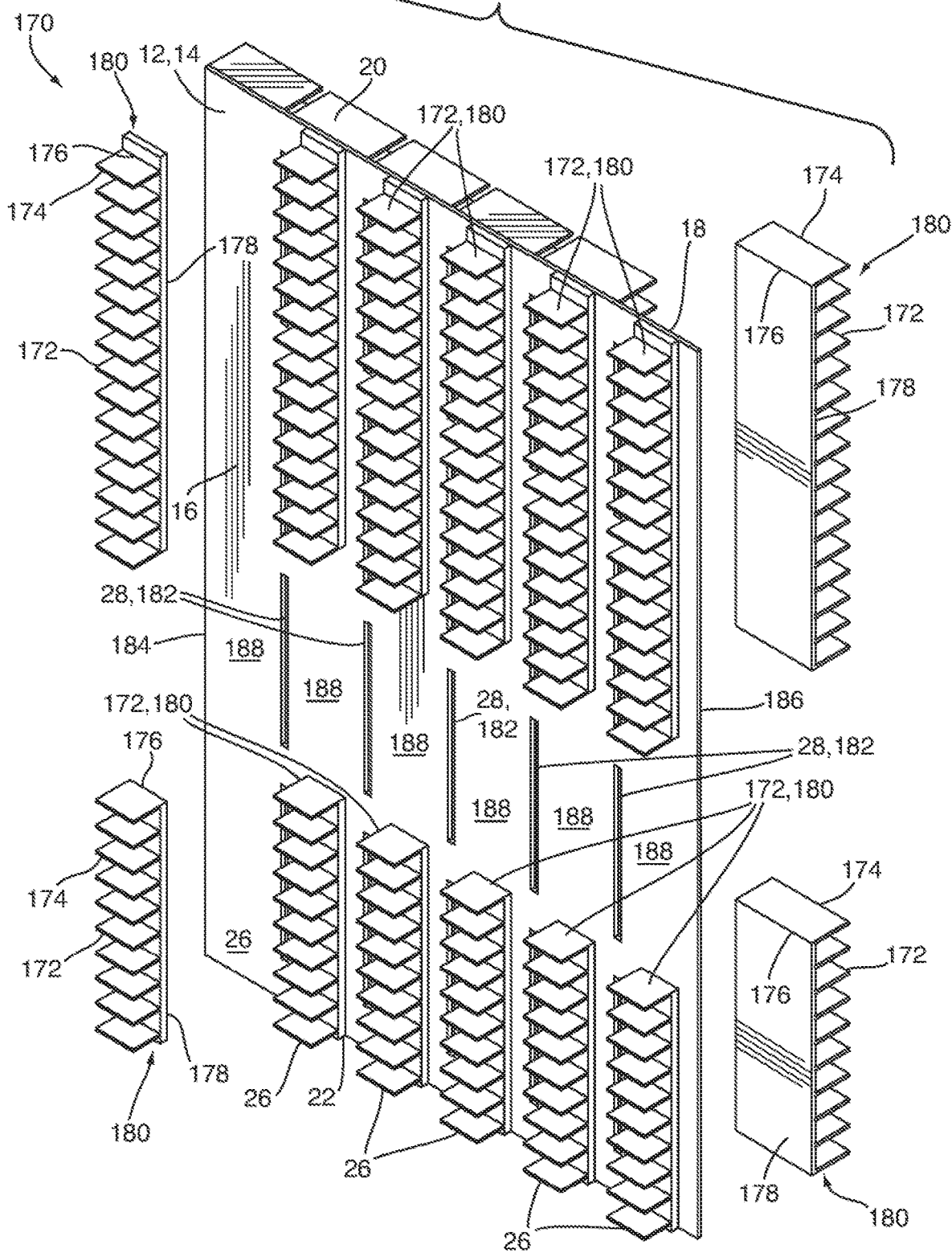
FIG. 17 is a perspective view of a heat spreader element of a thermal management device according to a fifth embodiment, shown in flattened form.
Figure 18:
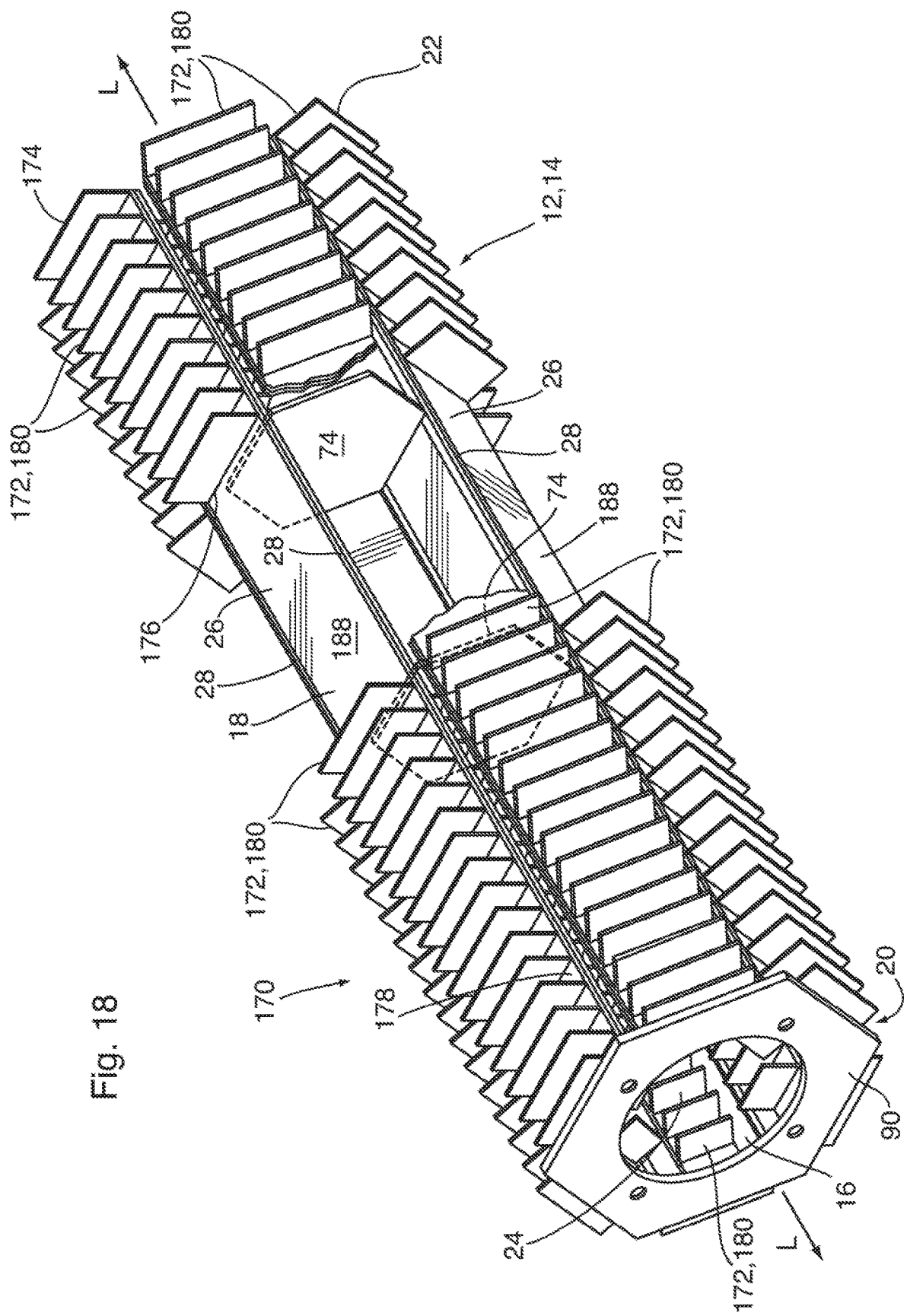
FIG. 18 is a partly cut-away perspective end view of the thermal management device of FIG. 17.

FIGS. 17 and 18 do not show all the features of thermal management device 170, and only show a single layer tubular heat spreader element 12 with upstanding fins attached thereto. It will be appreciated that thermal management device 170 may also include two-phase cooling elements 98, electronic components such as LEDs, TIM layers 32, circuit boards 34, internal electronic components 76, a fan unit 80, all as previously described above.

The wall 14 of heat spreader element 12 is tubular, extends along the longitudinal axis L, has an inner surface 16 and an outer surface 18, longitudinally spaced first and second open ends 20, 22, and a hollow internal space 24. The wall 14 has a plurality of facets 26 when viewed from the end or in transverse cross section, each facet being rectangular and elongated along axis L. There are six facets 26 in device 170, with the wall 14 having a hexagonal transverse cross section. As previously described, the wall 14 is not necessarily of constant cross-section.

Upstanding cooling fins 172 are provided along, and in thermal contact with, at least one of the inner and outer surfaces 16, 18 of wall 14, to conduct and radiate heat away from the wall 14 of heat spreader element 12. The upstanding fins 172 have free edges 174 which are distal to the wall 14, and the fins 172 may optionally extend vertically from wall 14 relative to the longitudinal axis L. However, they may instead be angled relative to axis L. The upstanding fins 172 also have secured edges 176 along which the upstanding fins 172 are connected to the wall 14, either directly or through a base layer 178. The upstanding fins 172 can be integrally formed with the base layer 178 by folding a thin sheet of metal to form a series of transversely extending corrugations, and compressing the corrugations in the longitudinal direction to form flat upstanding fins 172. In such a structure, the base layer 178 may comprise a single layer of metal, which the upstanding fins 172 comprise two layers. It will be appreciated that the flat upstanding fins 172 of device 170 may be replaced by another form of structure, such as a corrugated fin or other turbulence-enhancing insert as described above.

The upstanding fins 172 of device 170 and their free edges 174 extend substantially transversely to the longitudinal axis L. This type of fin arrangement is optimized for a transverse flow of cooling medium over and between the upstanding fins 172, such as where the thermal management device 170 is incorporated into a horizontally mounted, air cooled, LED lighting device. The air will circulate upwardly between the upstanding fins 172 as it absorbs heat therefrom, either through natural convection or with the assistance of a fan unit 80.

The upstanding fins 172 on both the inner and outer surfaces 16, 18 are arranged as a plurality of discrete groups 180, each discrete group 180 being provided on one of the facets 26 of wall 14. In the present embodiment, each group 180 comprises a flat base layer 178 with a plurality of attached upstanding fins 172, each group 180 having a width which is the same or slightly less than the width of each facet 26. The discrete groups 180 of upstanding fins 172 are spaced apart from one another by the bends 28 between the facets 26.

FIG. 17 shows the wall 14 of heat spreader element 12 in flattened form, prior to being folded into tubular form. The bends 28 between the facets 26 extend substantially longitudinally and are formed along pre-defined bend lines which may be defined by perforating, scoring or notching the wall 14. In the present embodiment, each bend line is defined by one or more perforations 182, each of which comprises an elongate slit, extending substantially longitudinally.

The perforations 182 not only serve to define the bend lines to assist in forming the tubular wall 14, but they also permit the cooling medium to flow between the inner and outer surfaces 16, 18 of the tubular wall 14. This may be useful in embodiments where the flow of cooling medium through the internal space 24 of wall 14 is not predominantly longitudinal, for example where the thermal management device 170 is incorporated into a horizontally mounted LED lighting device. It will be appreciated that perforations 182 may also be provided in embodiments where the wall 14 is not bent along pre-formed bend lines, as in a thermal management device having a smoothly bent tubular wall 14, similar to that shown in FIG. 12.

The flattened heat spreader element 12 of FIG. 17 includes first and second side edges 184, 186, which are in an opposed, transversely spaced arrangement. The side edges 184, 186 extend substantially longitudinally. When the wall 14 is bent and folded into tubular shape, the side edges are brought into an overlapping arrangement and joined together, similar to flanges 156 in FIGS. 13-15, to form a longitudinal seam.

Along the outer surface 18 of tubular wall 14, each of the facets 26 includes an area 188 in which electronic components such as LEDs 30 will be secured to wall 14, as described above. In the present embodiment, this area 188 is located between the ends 20, 22, and discrete groups 180 of upstanding fins 172 are provided on both sides of the area 184. Where one or more of the facets 26 of heat spreader element 12 includes two-phase cooling elements 98, the area 188 will correspond to the area of the evaporation zone 116, and the areas of discrete group 180 of upstanding fins 172 will correspond to the area of one of the condensation zones 118.

In some embodiments, upstanding fins 172 may be provided along substantially the entire length of the inner surface 16 of tubular wall 14, including the portions of inner surface 16 which are directly opposite to the LEDs 30, defined by area 188. However, in the present embodiment, the areas of wall 14 which are covered by upstanding fins 172 are substantially the same on both the inner and outer surfaces 16, 18 of wall 14, and there are no upstanding fins 172 on the portion of inner surface 16 which corresponds to area 188. Such an arrangement may be useful where there is an electronic component 76 enclosed within the hollow internal space 24, in the region corresponding to area 188.

Where the tubular wall 14 is comprised of aluminum or an aluminum-clad sheet material, the upstanding fins 172 may likewise be comprised of aluminum and metallurgically bonded to the tubular wall 14 by brazing. Where the surfaces of tubular wall 14 to which fins 172 are bonded are clad with copper or nickel, the fins 172 may comprise copper or may be clad with copper or nickel.

As shown in FIG. 18, the hollow internal space 24 of wall 14 may be provided with one or more transverse walls or baffles 74 to partly or completely block longitudinal air flow through internal space 24. A portion of wall 14 is cut away in FIG. 18 to show baffles 74. In the present embodiment there are two baffles 74, one at each end of the area 188. An electronic component 76 may be enclosed between the baffles 74, with cooling medium entering and leaving the area between baffles 74 through the perforations 182 in wall 14. The baffles 74 may be perforated where additional flow of cooling medium is desired.

The thermal management device 170 may include a mounting flange 90 at one end 20, 22 of heat spreader element 12, for attachment to a base and/or a fan unit.

While various embodiments have been described in connection with the present disclosure, it will be understood that certain adaptations and modifications of the described exemplary embodiments can be made as construed within the scope of the present disclosure. Therefore, the above discussed embodiments are considered to be illustrative and not restrictive.

What is claimed is:

1. A thermal management device for electronic components, comprising:
    (a) a multi-sided heat spreader element defining a longitudinal axis and comprising a longitudinally extending multi-sided wall and an internal space at least partly enclosed within the multi-sided wall, the multi-sided wall having an inner surface, an outer surface and longitudinally spaced first and second ends;

(b) a plurality of electronic components mounted to the outer surface of the wall of the heat spreader element;

(c) a flow space for a cooling medium provided in the internal space of the heat spreader element; and (d) one or more perforations through the multi-sided wall to permit flow of the cooling medium between the inner and outer surfaces of the multi-sided wall;

wherein the tubular heat spreader element comprises at least one layer of a thermally conductive metal which is bendable from a flat shape to the shape of said multi-sided wall.

2. The thermal management device of claim 1, further comprising a plurality of upstanding fins which are provided along, and in thermal contact with, at least one of the inner and outer surfaces of the multi-sided wall of the heat spreader element.

3. The thermal management device of claim 2, wherein at least some of said upstanding fins have free edges extending substantially transverse to the longitudinal axis.

4. The thermal management device of claim 1, wherein the multi-sided wall of the heat spreader element comprises at least one two-phase cooling element, wherein each said two-phase cooling element is a vapor chamber or a heat pipe.

5. The thermal management device of claim 4, wherein each of the at least one two-phase cooling elements is elongated along the longitudinal axis;

wherein each of the at least one two-phase cooling elements includes an evaporation zone and a condensation zone; and wherein each of the plurality of electronic components is located on top of and in thermal contact with the evaporation zone of one of the at least one two-phase cooling elements.

6. The thermal management device of claim 5, further comprising a plurality of upstanding fins, each of which is provided on, and in thermal contact with, the inner surface or the outer surface of the multi-sided wall; and wherein each of the upstanding fins is located on top of and in thermal contact with the condensation zone of one of the two-phase cooling elements.

7. The thermal management device of claim 1, wherein the at least one bendable layer of the multi-sided wall is smoothly bent to provide the tubular wall of the heat spreader with a smoothly rounded shape, when viewed in transverse cross section.

8. The thermal management device of claim 1, wherein the at least one bendable layer of the multi-sided wall is bent along a plurality of bend lines extending between the first and second ends of the multi-sided wall, such that the multi-sided wall of the heat spreader element comprises a plurality of facets when viewed in transverse cross section.

9. A thermal management device for electronic components, comprising:

(a) a multi-sided heat spreader element defining a longitudinal axis and comprising a longitudinally extending multi-sided wall and an internal space at least partly enclosed within the multi-sided wall, the multi-sided wall having an inner surface, an outer surface and longitudinally spaced first and second ends;

(b) a plurality of electronic components mounted to the outer surface of the wall of the heat spreader element;

(c) a flow space for a cooling medium provided in the internal space of the heat spreader element; and (d) one or more perforations through the multi-sided wall to permit flow of the cooling medium between the inner and outer surfaces of the multi-sided wall;

wherein the tubular heat spreader element comprises at least one layer of a thermally conductive metal which is bendable from a flat shape to the shape of said multi-sided wall;

wherein the at least one bendable layer of the multi-sided wall is bent along a plurality of bend lines extending between the first and second ends of the multi-sided wall, such that the multi-sided wall of the heat spreader element comprises a plurality of facets when viewed in transverse cross section; and wherein the perforations are provided along the bend lines.

10. The thermal management device of claim 9, further comprising a plurality of upstanding fins which are provided along, and in thermal contact with, at least one of the inner and outer surfaces of the multi-sided wall of the heat spreader element;

wherein the plurality of upstanding fins are arranged in a plurality of discrete groups, each discrete group of upstanding fins being provided on one of the facets of the multi-sided wall; and wherein the discrete groups of upstanding fins are spaced apart from one another by the bend lines and the perforations between the facets of the multi-sided wall.

11. The thermal management device of claim 8, wherein the bend lines between facets extend substantially longitudinally and at least one of said bend lines is pre-defined by perforating, scoring or notching the at least one bendable layer of the multi-sided wall along said bend line.

12. A thermal management device for electronic components, comprising:

(a) a multi-sided heat spreader element defining a longitudinal axis and comprising a longitudinally extending multi-sided wall and an internal space at least partly enclosed within the multi-sided wall, the multi-sided wall having an inner surface, an outer surface and longitudinally spaced first and second ends;

(b) a plurality of electronic components mounted to the outer surface of the wall of the heat spreader element;

(c) a flow space for a cooling medium provided in the internal space of the heat spreader element, including a first flow space for said cooling medium provided along the inner surface of the heat spreader element, the first flow space having an inlet and an outlet which are spaced apart along the longitudinal axis; and (d) a turbulence-enhancing insert provided in the first flow space;

wherein the tubular heat spreader element comprises at least one layer of a thermally conductive metal which is bendable from a flat shape to the shape of said multi-sided wall; and wherein the turbulence-enhancing insert comprises a plurality of corrugations arranged with openings through the corrugations being longitudinally oriented.

13. The thermal management device according to claim 12, wherein the multi-sided wall of the heat spreader element is tubular, and the thermal management device further comprises a tubular inner sleeve spaced radially inwardly from the tubular wall of the heat spreader element, wherein the tubular inner sleeve includes a longitudinal wall portion with a hollow interior defining a second flow space for a cooling medium, and wherein the first flow space is defined between the longitudinal wall portion of the tubular inner shell and the tubular wall of the heat spreader element;

wherein the corrugations of the turbulence-enhancing insert each have a top surface in thermal contact with the tubular wall of the heat spreader element, a bottom surface in thermal contact with the longitudinal wall portion of the tubular inner shell, and a radially-oriented side wall extending between the top and bottom surfaces.

14. The thermal management device of claim 13, further comprising one or more heat-generating components located inside the longitudinal wall portion of the tubular inner shell;

wherein the tubular inner shell further includes a transverse wall which extends across the inside of the longitudinal wall portion; and wherein the transverse wall is provided with one or more perforations to permit flow of the cooling medium through the second flow space.

15. The thermal management device of claim 1, wherein the plurality of electronic components comprises a plurality of light-emitting diodes (LEDs);

wherein the thermal management device further comprises a fan unit located proximate to the first end or the second end of the multi-sided wall of the heat spreader element, the fan unit being adapted to circulate the cooling medium through the interior space of the heat spreader element;

wherein the fan unit includes a temperature-responsive proportional speed control to maintain the LEDs at a specific temperature in order to maintain a specific color or light output.

16. The thermal management device according to claim 1, wherein the plurality of electronic components comprises a plurality of light-emitting diodes (LEDs); and wherein the thermal management device further comprises a clear or translucent lens provided over the outer surface of the multi-sided wall of the heat spreader element and over the LEDs.

17. A method of manufacturing the thermal management device of claim 1, comprising:

providing a flat metal substrate comprising the at least one bendable layer of the tubular wall;

forming a plurality of bend lines on at least one of the inner and outer surfaces of the flat metal substrate, wherein the plurality of bend lines are formed by scoring, perforating or notching the flat metal substrate; and bending the flat metal substrate along the bend lines and forming said multi-sided heat spreader element, wherein the multi-sided heat spreader element comprises a plurality of facets, each of the facets being substantially flat and being defined between two of said bend lines.

18. The method of claim 17, further comprising mounting the electronic components to the outer surface of the flat metal substrate before the step of bending the flat metal substrate.

* * * * *